US012300715B2

(12) United States Patent
Huang et al.

(10) Patent No.: US 12,300,715 B2
(45) Date of Patent: May 13, 2025

(54) CAPACITOR STRUCTURE

(71) Applicant: TAIWAN SEMICONDUCTOR MANUFACTURING COMPANY LTD., Hsinchu (TW)

(72) Inventors: Chang-Yu Huang, Hsinchu County (TW); Yi Hsuan Lin, Taichung (TW); Chih-Pin Hung, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 565 days.

(21) Appl. No.: 17/671,225

(22) Filed: Feb. 14, 2022

(65) Prior Publication Data

US 2023/0261038 A1    Aug. 17, 2023

(51) Int. Cl.
*H01L 27/01*   (2006.01)
*H01L 23/522*  (2006.01)
*H01L 49/02*   (2006.01)

(52) U.S. Cl.
CPC .......... *H01L 28/86* (2013.01); *H01L 23/5223* (2013.01); *H01L 27/01* (2013.01); *H01L 28/90* (2013.01)

(58) Field of Classification Search
CPC .......... H01L 27/01; H01L 28/86; H01L 28/90
See application file for complete search history.

(56) References Cited

U.S. PATENT DOCUMENTS

2014/0001597 A1\*   1/2014   Huang ................ H01L 21/7682
                                                       257/532

\* cited by examiner

*Primary Examiner* — Samuel A Gebremariam
(74) *Attorney, Agent, or Firm* — WPAT LAW; Anthony King

(57) ABSTRACT

A capacitor structure is provided. The capacitor structure includes a first electrode and a second electrode. The first electrode includes a first segment and a third segment. The second electrode includes a second segment and a fourth segment, the second segment is interposed between the first segment and the third segment, and the third segment is interposed between the second segment and the fourth segment. A first distance is between the first segment and the second segment, and a second distance between the second segment and the third segment. The first distance is different from the second distance.

20 Claims, 21 Drawing Sheets

CAPACITOR STRUCTURE

BACKGROUND

Electronic equipment involving semiconductor devices is essential for many modern applications. Technological advances in materials and design have produced generations of semiconductor devices where each generation has smaller and more complex circuits than the previous generation. Capacitors are used in many applications involving integrated circuits (IC), including for signal conditioning. One of the most commonly used capacitors is the metal-oxide-metal (MOM) capacitor. However, there are challenges in improving the performance of the MOM capacitors.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
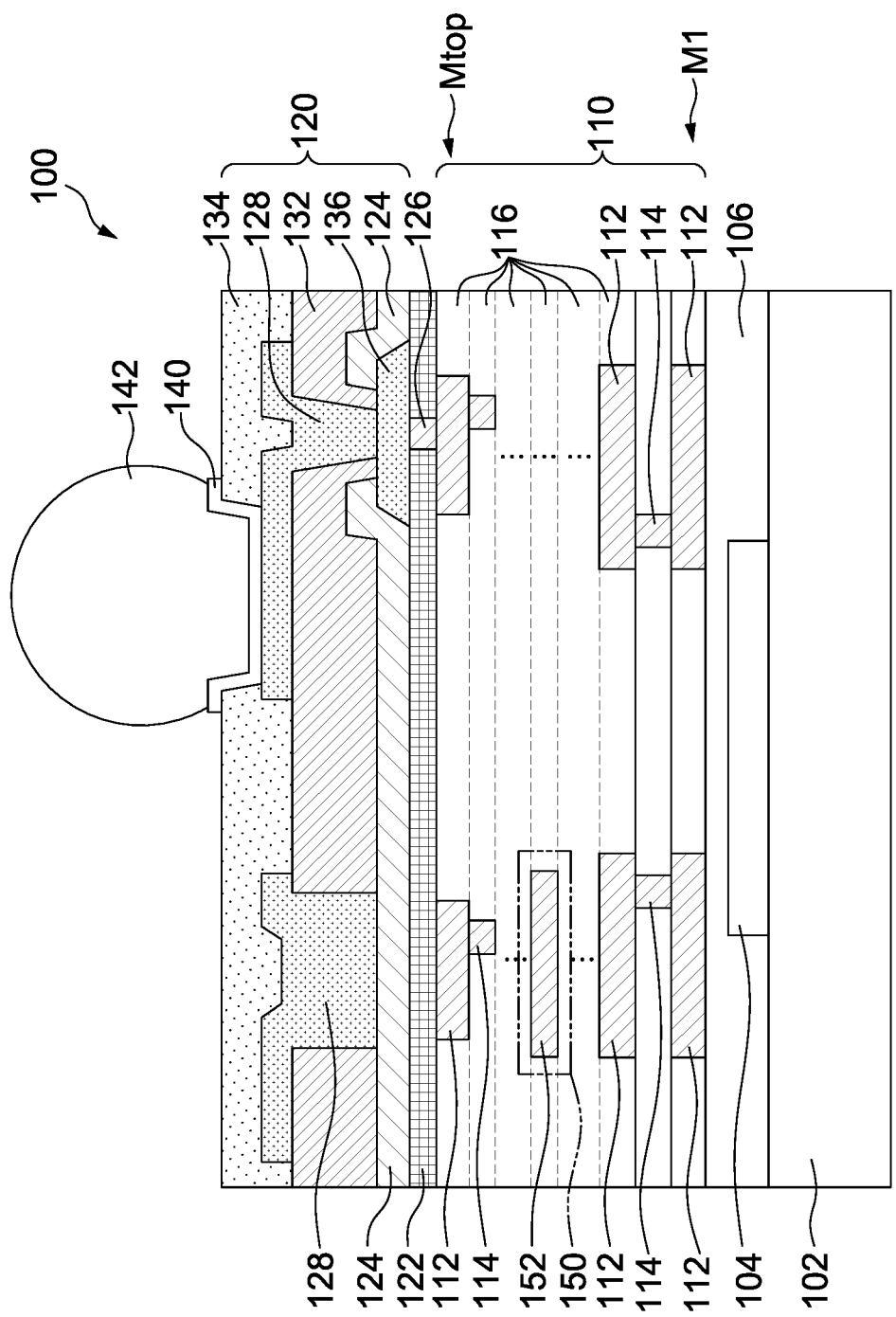
FIG. 1 is a cross-sectional view illustrating a semiconductor structure according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Capacitors are widely used in integrated circuits. One of the most commonly used capacitors is the metal-oxide-metal (MOM) capacitor. A MOM capacitor may include a first electrode, a second electrode, and an insulation layer therebetween. A capacitance of the MOM capacitor is proportional to its area and an electric constant, and is inversely proportional to a thickness of the insulation layer. The electric constant may be related to a voltage between the first electrode and the second electrode. To increase the capacitance, it is preferable to increase the area and/or to reduce the thickness of the insulation layer.

Methods for increasing the area of the capacitor have been explored. For example, the first electrode and the second electrode may respectively include fingers and a bus that connects all the fingers. The fingers of the first electrode and the fingers of the second electrode are arranged in an alternating pattern. Therefore, each finger forms a sub capacitor(s) with its neighboring fingers or the bus. A total capacitance of the capacitor is equivalent to a sum of capacitances of the sub capacitors. However, a problem associated with increasing the area of the MOM capacitor is that the capacitance varies based on voltage bias. Accordingly, an alternative design of the MOM capacitor is therefore of primary importance.

Some embodiments of the present disclosure provide a capacitor structure that provides one or more improvements over existing approaches. The proposed capacitor structure includes at least one segment having a width, a length or a space different from that of other segments. Hence, capacitances of different regions of the proposed capacitor structure may be different. A total capacitance of the proposed capacitor structure may be substantially unaffected by voltage bias. Accordingly, better performance of the proposed capacitor structure may be expected. Throughout the various illustrations and embodiments of the present invention, like reference numbers are used to designate like elements.

FIG. 1 is a cross-sectional view illustrating a semiconductor structure 100 according to aspects of one or more embodiments of the present disclosure. Referring to FIG. 1, a semiconductor structure 100 is provided. The semiconductor structure 100 includes a semiconductor substrate 102. The semiconductor substrate 102 may be a bulk silicon substrate or a silicon-on-insulator substrate. Alternatively, other semiconductor materials that include group III, group IV, and group V elements may also be used, including silicon germanium, silicon carbon, and III-V compound semiconductor materials. Integrated circuit devices such as transistors (schematically illustrated as 104) are formed in and/or on the semiconductor substrate 102.

The semiconductor structure 100 may further include an inter-layer dielectric (ILD) 106 over the semiconductor substrate 102, and an interconnect structure 110 over the ILD 106. The interconnect structure 110 includes metal lines 112 and vias 114, which are formed in one or more dielectric layers 116. The combination of metal lines 112 at a same level is hereinafter referred to as a metal layer (or a metallization layer). Accordingly, the interconnect structure 110 may include a plurality of the metal layers (e.g., the metal lines 112) that are interconnected through the vias 114. The metal layers include a bottom metal layer (M1) through a top metal layer (Mtop). In some embodiments, the Mtop layer is a topmost metal layer formed in the dielectric layer 116.

The metal lines 112 and the vias 114 may be formed of conductive materials such as metals, metal alloys, metal silicides, metal nitrides, and the like. In some embodiments, the metal lines 112 and the vias 114 include a conductive material such as Al, Cu, AlCu or W, but are not limited thereto. The metal lines 112 and the vias 114 may further include materials such as Ti, Ta, Co, Ni, Mn, Rh, Ru, Hf, Zn, Sn, Sb, N, C, O and Si. In some embodiments, the dielectric layers 116 are formed of low-k dielectric materials. Dielectric constants (k values) of the low-k dielectric materials may be less than about 3.0, or less than about 2.5, for example.

The semiconductor structure 100 may further include a post-passivation interconnect (PPI) structure 120 over the interconnect structure 110. The PPI structure 120 includes one or more passivation layers 122 and 124, one or more vias 126 and 128, one or more polymer layers 132 and 134, and one or more metal pads 136.

The passivation layer 122 is formed over the top metal layer Mtop and the respective dielectric layer 116 in which the metal layer Mtop is located. The passivation layer 124 is formed over the passivation layer 122. The passivation layers 122 and 124 may each have a k value greater than 3.8, and are formed using a non-low-k dielectric material. In some embodiments, the passivation layers 122 and 124 are composite layers comprising a silicon oxide layer (not shown), and a silicon nitride layer (not shown) over the silicon oxide layer. The passivation layers 122 and 124 may also be formed of other non-porous dielectric materials such as un-doped silicate glass (USG), silicon oxynitride, and the like. The passivation layers 122 and 124 may be formed of a same dielectric material, or may be formed of different dielectric materials.

The via 126 formed in the passivation layer 122 may be electrically connected to the metal line 112. In some embodiments, the via 126 is further electrically coupled to one or more of the integrated circuit devices 104. The metal pad 136 is formed over the passivation layer 122, and may be electrically coupled to the integrated circuit devices 104 through the metal lines 112, the vias 114 and the via 126. The metal pad 136 may be an aluminum pad or an aluminum-copper pad, although other metallic materials may be used.

The polymer layers 132 and 134 are formed over the passivation layer 124. The polymer layers 132 and 134 may comprise a polymer selected from polyimide, benzocyclobutene (BCB), polybenzoxazole (PBO), and/or the like. The via 128 is formed over the polymer layer 132 and is electrically connected to the metal pad 136.

The semiconductor structure 100 may further include one or more under-bump-metallurgy (UBM) layers 140 and one or more connectors 142. In some embodiments, the UBM layer 140 includes a barrier layer (not shown) and a seed layer (not shown) over the barrier layer. The UBM layer 140 extends into an opening in the polymer layer 134, and is electrically coupled to, and may be in physical contact with, the via 128. The barrier layer may be a titanium layer, a titanium nitride layer, a tantalum layer, a tantalum nitride layer, or layers formed of a titanium alloy or a tantalum alloy. The materials of the seed layer may include copper or copper alloys. The connector 142 may be a metal ball, such as a solder ball or a copper ball, or a metal pillar, such as a copper pillar. The connector 142 is electrically coupled to, and may be in physical contact with, the UBM layer 140.

The semiconductor structure 100 may further include a capacitor structure 150 disposed in the interconnect structure 110. In some embodiments, the capacitor structure 150 includes a conductive layer 152. The material of the conductive layer 152 may be selected from the same candidate materials of the metal lines 112 and the vias 114.

In some comparative embodiments, a capacitor structure includes a first electrode and a second electrode. The first and second electrodes may be formed in a same metal layer (e.g., the conductive layer 152). The first electrode includes first segments and a first bus that connects all the first segments. The second electrode includes second segments and a second bus that connects all the second segments. The first segments of the first electrode and the second segments of the second electrode are arranged in an alternating pattern. The first segments and the second segments are equally spaced apart from each other. Each first segment of the first electrode may have an identical width and an identical length. Each second segment of the second electrode may have an identical width and an identical length. Additionally, the width and the length of the first segment are respectively same as the width and the length of the second segment.

Each first segment is spaced apart from its neighboring second segments by a first distance. In addition, each second segment is spaced apart from its neighboring first segments by the first distance. Each first/second segment forms a first sub capacitor with each of its neighboring second/first segments. Each first segment is spaced apart from its neighboring second bus by a second distance. Each second segment is spaced apart from its neighboring first bus by the second distance. Each first/second segment forms a second sub capacitor with its neighboring second/first bus. A total capacitance of the capacitor structure is equivalent to a sum of capacitances of the first and second sub capacitors. However, it is observed that the capacitance of the capacitor structure varies based on a voltage bias.

Figure 2:
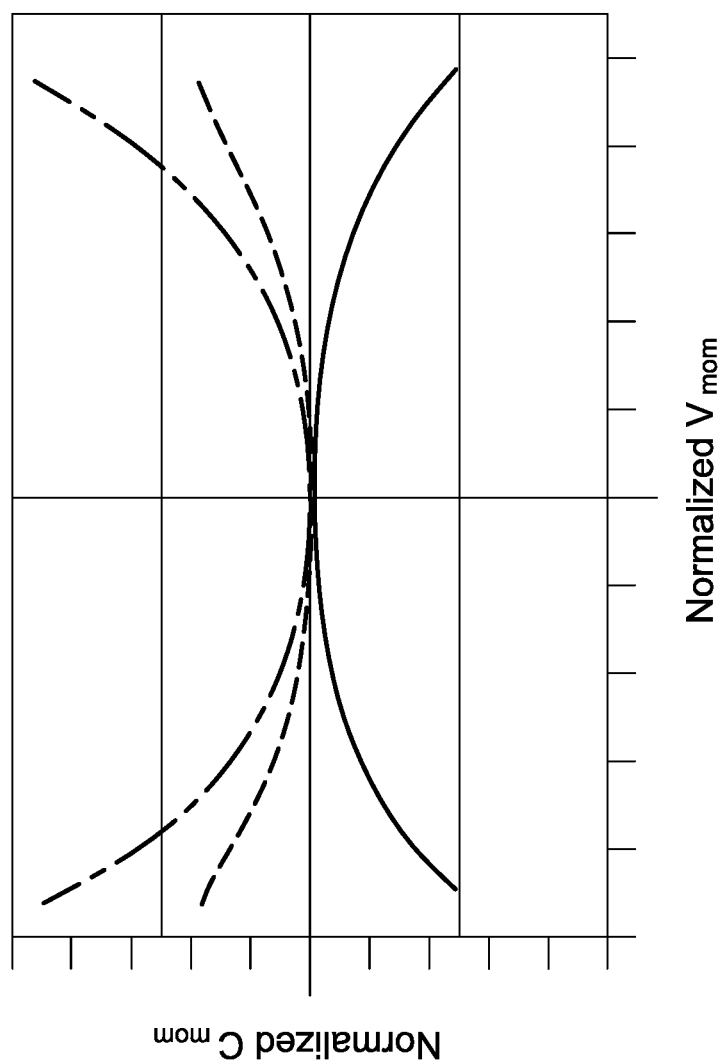
FIG. 2 is a diagram showing normalized capacitance corresponding to normalized voltage, in accordance with some comparative embodiments of the present disclosure.
Figure 3:
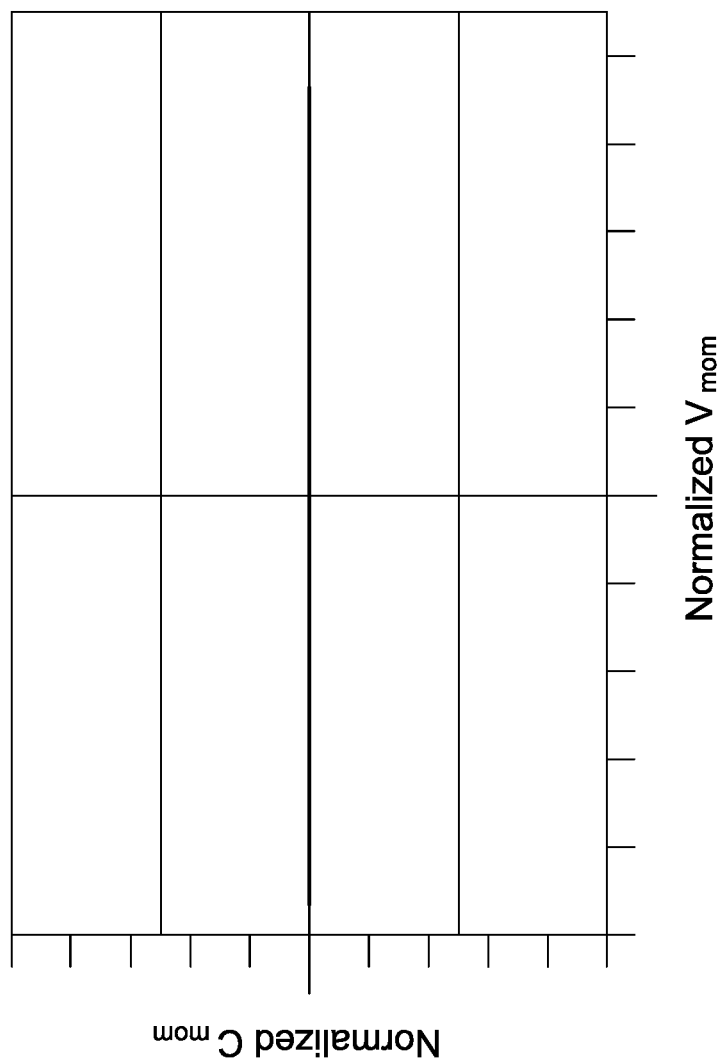
FIG. 3 is a diagram showing normalized capacitance corresponding to normalized voltage, in accordance with some embodiments of the present disclosure.

FIG. 2 is a diagram showing normalized capacitance (Y axis) corresponding to normalized voltage (X axis), in accordance with some comparative embodiments of the present disclosure. FIG. 3 is a diagram showing normalized capacitance (Y axis) corresponding to normalized voltage (X axis), in accordance with some embodiments of the present disclosure. Referring to FIG. 2, three sets of data are plotted in FIG. 2, all showing a variance in the capacitance based on a voltage bias, i.e., a variance in the capacitance at different voltage levels. It is shown that in a comparative capacitor structure, the capacitance varies drastically across a first range of voltage levels (e.g., in which the capacitance varies from a greatest value to a constant), the capacitance does not vary across a second range of voltage levels (e.g., in which the capacitance remains constant), and the capacitance varies drastically again across a third range of voltage levels (e.g., in which the capacitance varies from the constant to another greatest value). Solid lines of data show that the capacitance of the comparative capacitor structure remains constant only in the second range. The varied capacitance could lead to a performance degradation of the MOM capacitor. An alternative approach to obtaining a uniform capacitance (e.g., as shown in FIG. 3) is therefore of primary importance.

Figure 4A:
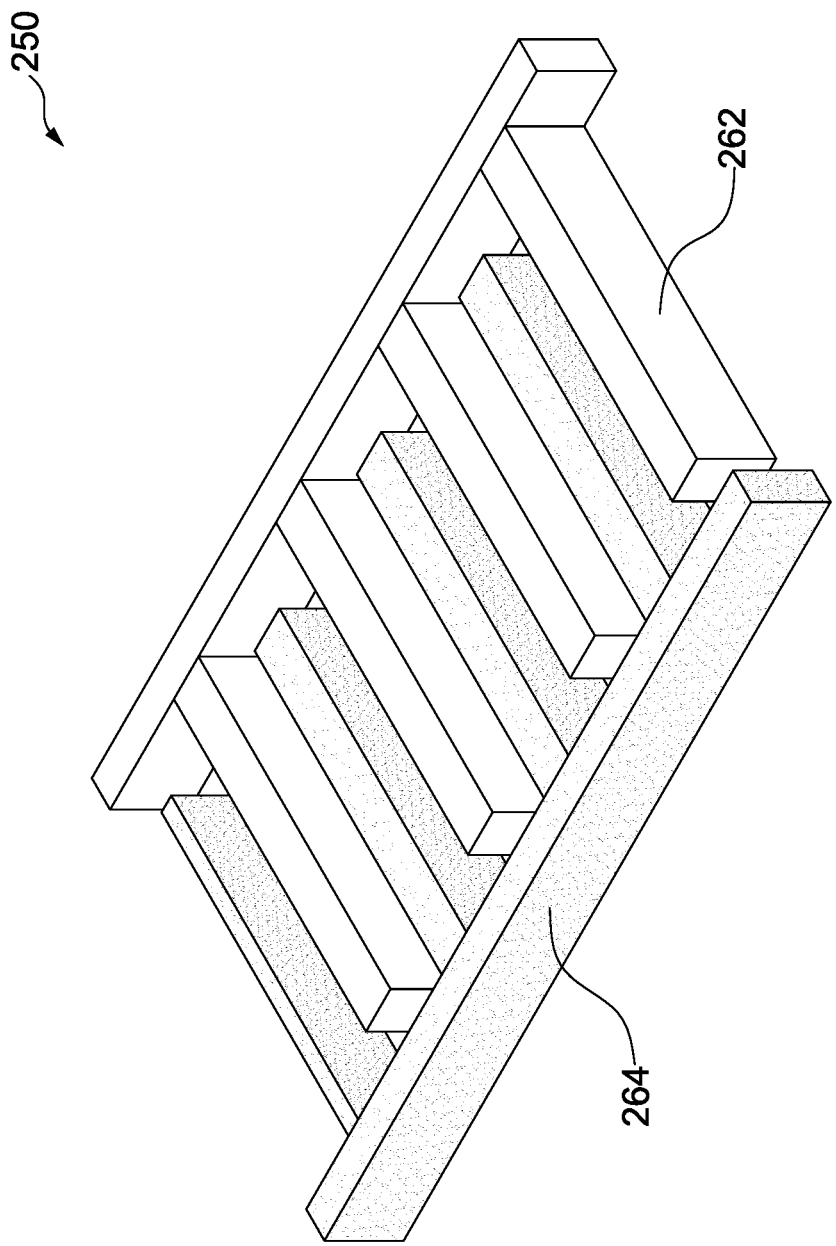
FIG. 4A is a perspective view illustrating a capacitor structure according to aspects of one or more embodiments of the present disclosure.
Figure 4B:
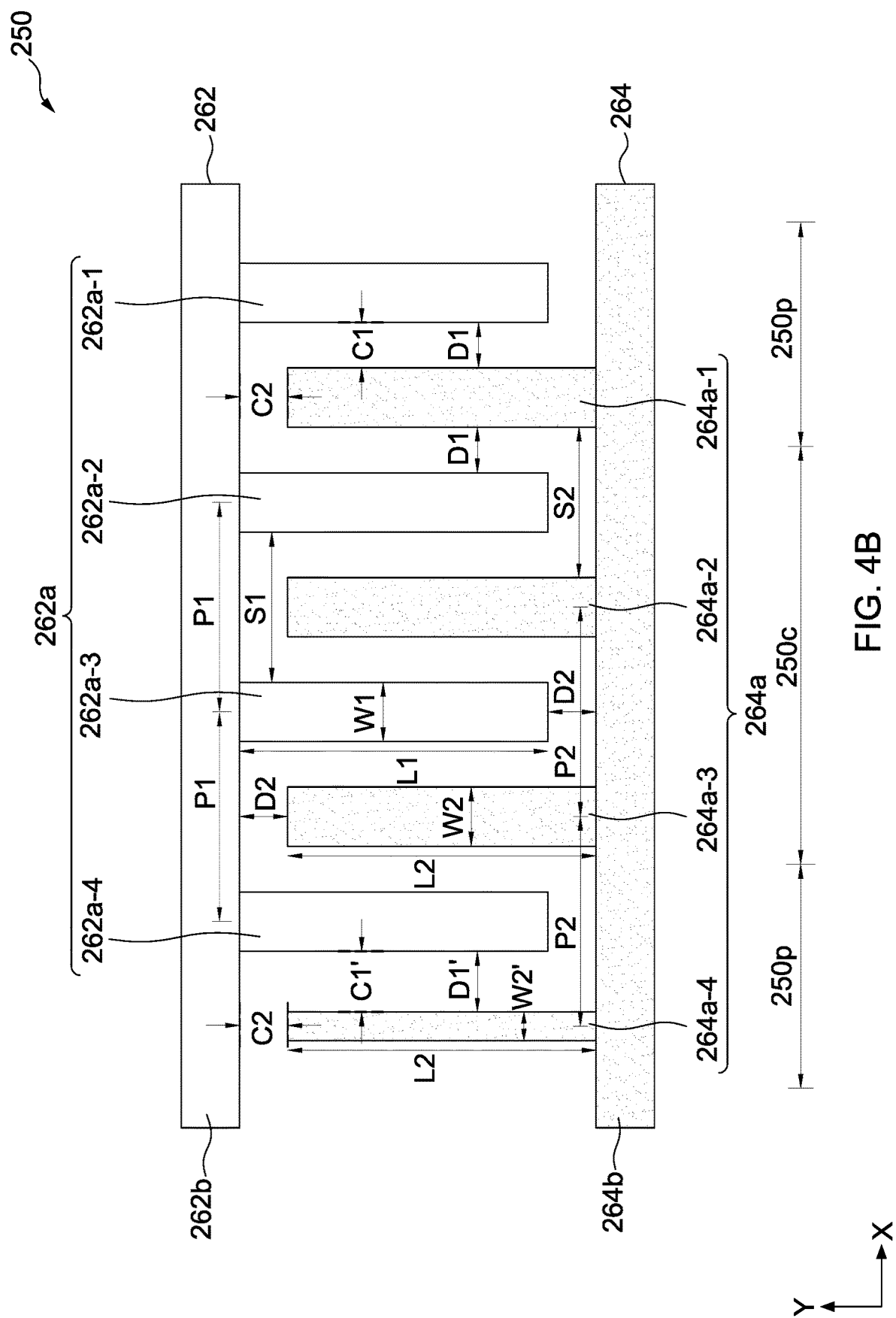
FIG. 4B is a top view illustrating the capacitor structure according to aspects of one or more embodiments of the present disclosure.

FIGS. 4A to 4B illustrate an alternative approach to obtaining a uniform capacitance. Referring to FIG. 4A, FIG. 4A illustrates a perspective view of a capacitor structure 250. The capacitor structure 250 may include two electrodes 262 and 264, which are separated by dielectric materials of the dielectric layer 116 (FIG. 1). Each of the electrodes 262 and 264 forms a three-dimensional structure. For clarity, the electrode 262 is shown as unpatterned, and the electrode 264 is patterned with dots. The electrodes 262 and 264 may be formed in a same metal layer (e.g., the conductive layer 152 in FIG. 1).

FIG. 4B illustrates a top view of the capacitor structure 250. The electrode 262 includes segments 262a and a bus 262b that connects all the segments 262a. The segments 262a extends in a first direction Y and the bus 262b extends in a second direction X. The electrode 264 includes segments 264a and a bus 264b that connects all the segments 264a. The segments 264a also extends in the first direction D1 and the bus 264b extends in a second direction X. The segments 262a of the electrode 262 and the segments 264a of the electrode 264 are arranged in an alternating pattern with a space between neighboring segments (264a/262a). In some embodiments, the segments 262a of the electrode 262 are equally spaced apart from each other. For example, the segments 262a are arranged with an equal space S1 between neighboring segments 262a. In addition, a pitch P1 between the segment 262a and each of its neighboring segments 262a is substantially consistent. In some embodiments, a pitch P2 between the segment 264a and each of its neighboring segments 264a is substantially consistent. In some embodiments, the pitch P1 is substantially equal to the pitch P2. In the present embodiment, the pitch P1 or P2 is defined as the center-line-to-center-line spacing between two adjacent segments 262a and 264a.

The segments 262a may include segments 262a-1, 262a-2, 262a-3 and 262a-4, and the segments 264a may include segments 264a-1, 264a-2, 264a-3 and 264a-4. Each segment 262a of the electrode 262 may have an identical width W1 and an identical length L1. Each segment 264a of the electrode 264 may have an identical length L2. The segments 264a-1, 264a-2 and 264a-3 may have an identical width W2, while the segment 264a-4 may have a width W2' different from the width W2. In some embodiments, the width W2' is at least 10% different from the width W2. As illustrated in FIG. 4B, the width W2 may be greater than the width W2'. In alternative embodiments, the width W2' is greater than the width W2.

Each of the segments 262a-1, 262a-2 and 262a-3 is spaced apart from its neighboring segments 264a-1, 264a-2 and 264a-3 by a distance D1. Each of the segments 262a-1, 262a-2 and 262a-3 forms a sub capacitor C1 with each of its neighboring segments 264a-1, 264a-2 and 264a-3. Due to a reduced width of the segment 264a-4, the segment 264a-4 is spaced apart from its neighboring segment 262a-4 by a distance D1'. The segment 264a-4 forms a sub capacitor C1' with its neighboring segment 262a-4. Each segment 262a is spaced apart from its neighboring bus 264b by a distance D2. Each segment 264a is spaced apart from its neighboring bus 262b by the distance D2. Each segment 262a/264a forms a sub capacitor C2 with its neighboring bus 264b/262b. A total capacitance of the capacitor structure 250 is equivalent to a sum of capacitances of the sub capacitors (e.g., C1, C1' and C2).

The capacitor structure 250 may have a central region 250c and a peripheral region 250p. The segments 262a-2, 262a-3, 264a-2 and 264a-3 are disposed in the central region 250c, while the segments 262a-1, 262a-4, 264a-1 and 264a-2 are disposed in the peripheral region 250p. Due to the reduced width of the segment 264a-4, the capacitance of the peripheral region 250p is different from that of the central region 250c. The total capacitance of the capacitor structure 250 may be substantially not affected by voltage bias. Hence, the capacitor structure 250 may have a uniform capacitance (e.g., as shown in FIG. 3).

The dielectric layer 116 (FIG. 1) is disposed between the electrodes 262 and 264. Due to the reduced width of the segment 264a-4, a thickness of the dielectric layer 116 varies between the electrodes 262 and 264. In some embodiments, a width of the dielectric layer 116 between the segment 262a-3 and the segment 264a-3 is different from a width of the dielectric layer 116 between the segment 262a-4 and the segment 264a-4.

The proposed capacitor structure provides advantages. In a comparative capacitor structure where the segments of the electrodes have equal widths and equal lengths, the capacitance of the comparative capacitor structure varies based on voltage bias. In contrast, the proposed capacitor structure includes at least one segment having a width different from those of the other segments. Hence, the capacitance of one region of the proposed capacitor structure may be different from capacitances of other regions. Furthermore, the proposed capacitor structure may have a uniform capacitance. Accordingly, a better performance of the proposed capacitor structure may be expected.

The structures of the present disclosure are not limited to the above-mentioned embodiments and may have other, different embodiments. To simplify the description and for the convenience of comparison between each of the embodiments of the present disclosure, the identical (or like) components in each of the following embodiments are marked with identical (or like) numerals. For making it easier to compare differences between the embodiments, the following description will detail dissimilarities among different embodiments, whereas details of identical features, values and definitions of embodiments will not be repeated.

Figure 5A:
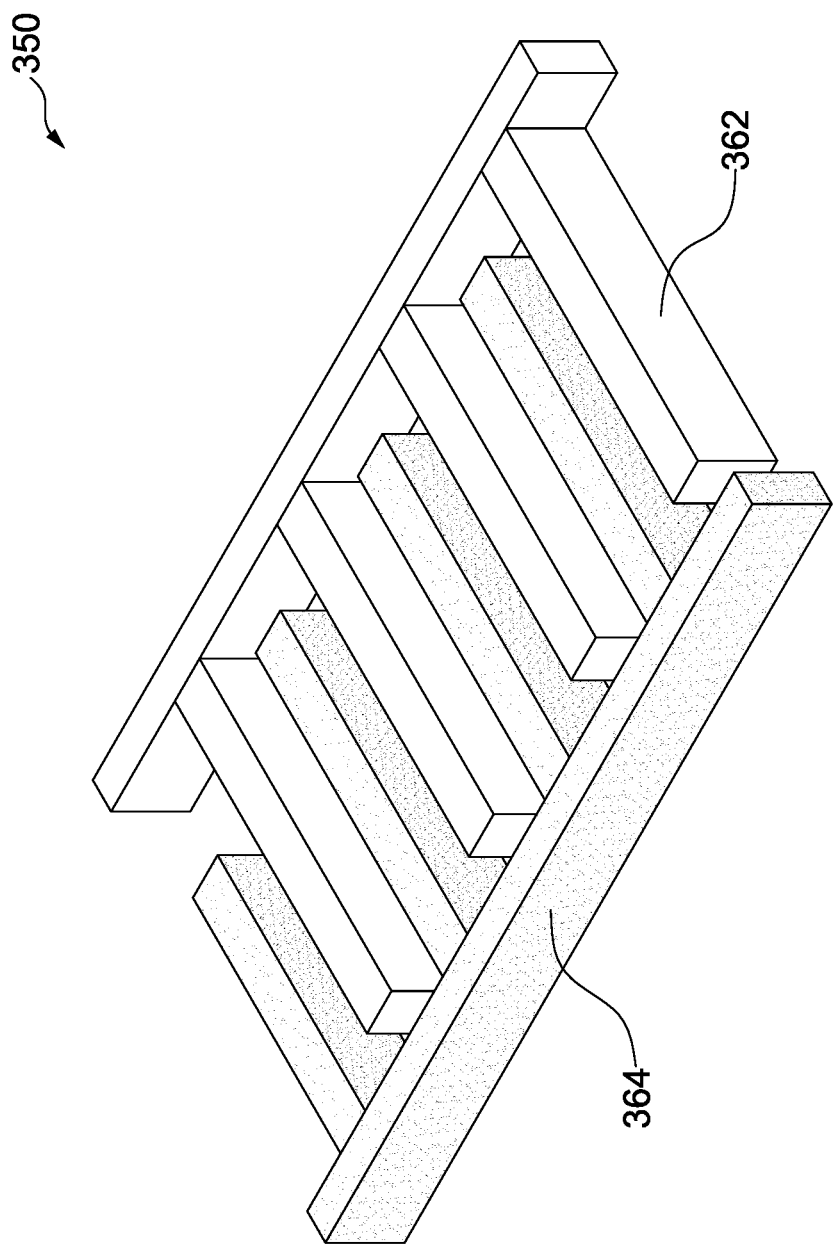
FIG. 5A is a perspective view illustrating a capacitor structure according to aspects of one or more embodiments of the present disclosure.
Figure 5B:
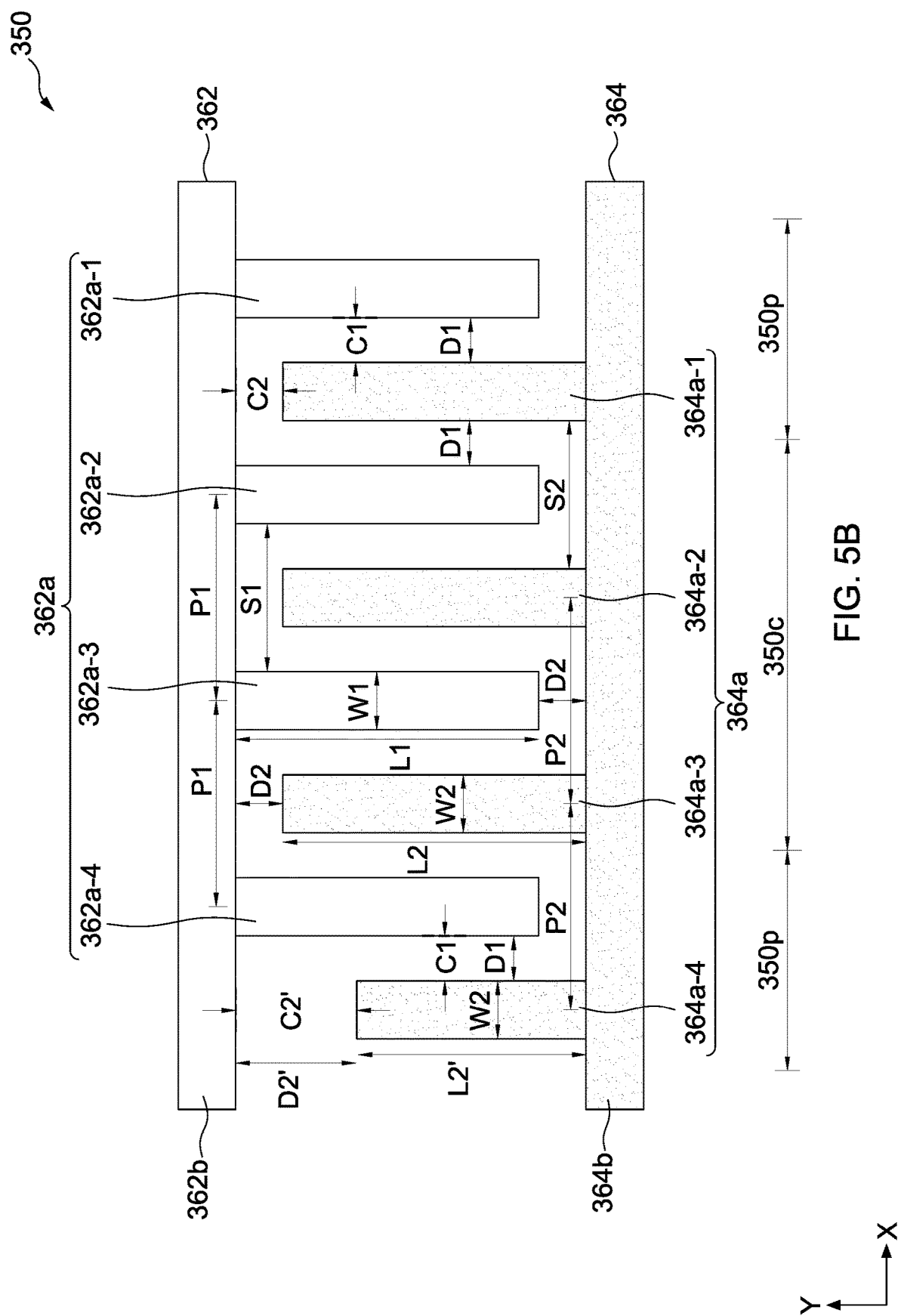
FIG. 5B is a top view illustrating the capacitor structure according to aspects of one or more embodiments of the present disclosure.

FIGS. 5A to 5B illustrate an alternative approach to obtaining a uniform capacitance. Referring to FIG. 5A, FIG. 5A illustrates a perspective view of a capacitor structure 350. The capacitor structure 350 may include two electrodes 362 and 364, which are separated by dielectric materials of the dielectric layer 116 (FIG. 1). Each of the electrodes 362 and 364 forms a three-dimensional structure. The electrodes 362 and 364 may be formed in a same metal layer (e.g., the conductive layer 152 in FIG. 1).

FIG. 5B illustrates a top view of the capacitor structure 350. The electrode 362 includes segments 362a and a bus 362b that connects all the segments 362a. The electrode 364 includes segments 364a and a bus 364b that connects all the segments 364a. In some embodiments, the segments 362a are arranged with an equal space S1 between neighboring segments 362a. In addition, the segments 364a are arranged with an equal space S2 between neighboring segments 364a. In some embodiments, the space S1 is substantially equal to the space S2. Additionally, a pitch P1 between the segment 362a and each of its neighboring segments 362a is substantially consistent, and a pitch P2 between the segment 364a and each of its neighboring segments 364a is substantially consistent. In some embodiments, the pitch P1 is substantially equal to the pitch P2.

The segments 362a may include segments 362a-1, 362a-2, 362a-3 and 362a-4, and the segments 364a may include segments 364a-1, 364a-2, 364a-3 and 364a-4. Each segment 362a of the electrode 362 may have an identical width W1 and an identical length L1. Each segment 364a of the electrode 364 may have an identical width W2. The segments 364a-1, 364a-2 and 364a-3 may have an identical length L2, while the segment 364a-4 may have a length L2' different from the length L2. In some embodiments, the length L2' is at least 10% different from the length L2. As illustrated in FIG. 5B, the length L2 may be greater than the length L2'. In alternative embodiments, the length L2' is greater than the length L2.

Each segment 362a is spaced apart from its neighboring segments 364a by a distance D1. Each segment 362a forms a sub capacitor C1 with each of its neighboring segments 364a. Each segment 362a is spaced apart from its neighboring bus 364b by a distance D2. Each segment 362a forms a sub capacitor C2 with its neighboring bus 364b. Each of the segments 364a-1, 364a-2 and 364a-3 is spaced apart from its neighboring bus 362b by the distance D2. Each of the segments 364a-1, 364a-2 and 364a-3 forms a sub capacitor C2 with its neighboring bus 362b. Due to a reduced length of the segment 364a-4, the segment 364a-4 is spaced apart from its neighboring bus 362b by a distance D2'. The segment 364a-4 forms a sub capacitor C2' with its neighboring bus 362b. A total capacitance of the capacitor structure 350 is equivalent to a sum of capacitances of the sub capacitors (e.g., C1, C2 and C2').

In some alternative embodiments, the segment 364a-4 may have the reduced length and a reduced width similar to the reduced width of the segment 264a-4. The segment 364a-4 may form a sub capacitor C2' with its neighboring bus 362b and a sub capacitor C1' with its neighboring segment 362a-4. A total capacitance of the capacitor structure 350 may be equivalent to a sum of capacitances of the sub capacitors (e.g., C1, C1', C2 and C2').

The capacitor structure 350 may have a central region 350c and a peripheral region 350p. Due to the reduced length of the segment 364a-4, the capacitance of the peripheral region 350p is different from that of the central region 350c. The total capacitance of the capacitor structure 350 may be substantially not affected by voltage bias. Hence, the capacitor structure 350 may have a uniform capacitance (e.g., as shown in FIG. 3).

Figure 6A:
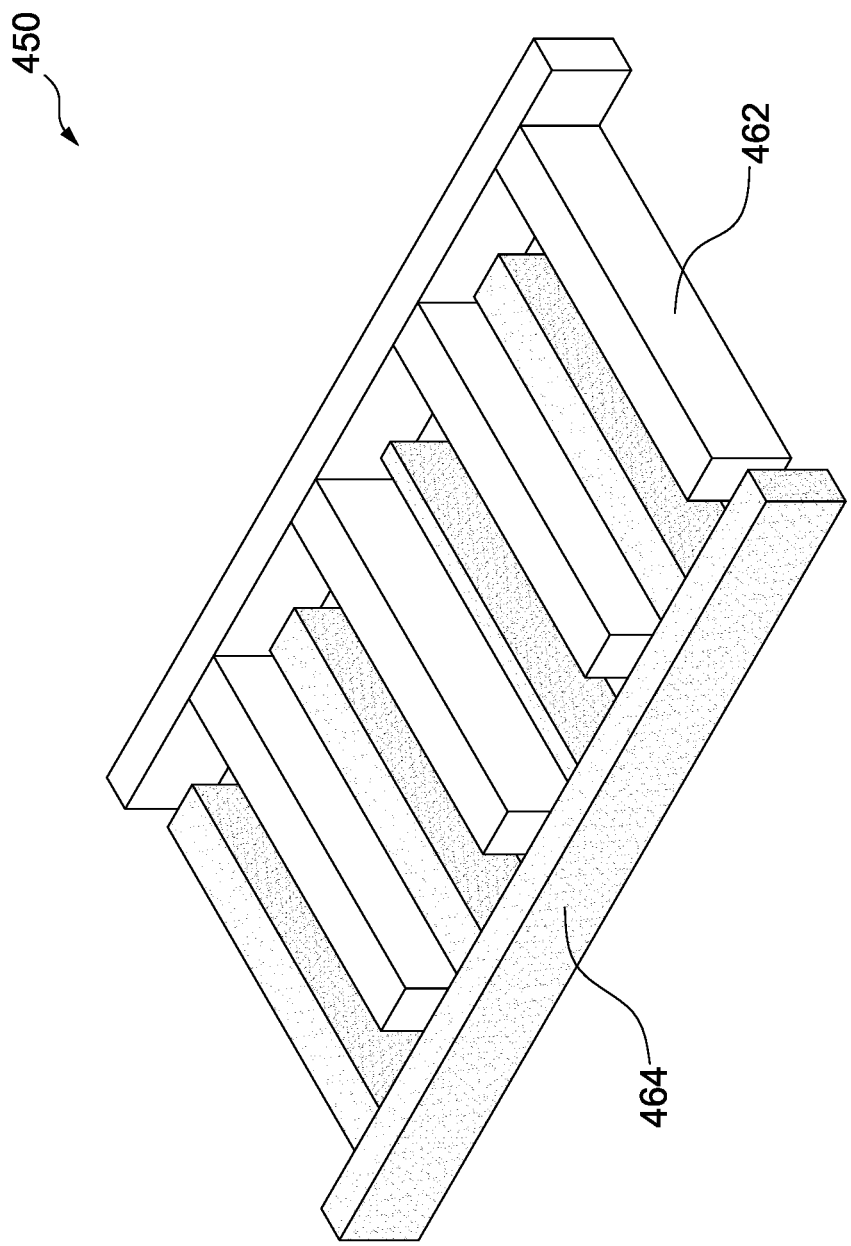
FIG. 6A is a perspective view illustrating a capacitor structure according to aspects of one or more embodiments of the present disclosure.
Figure 6B:
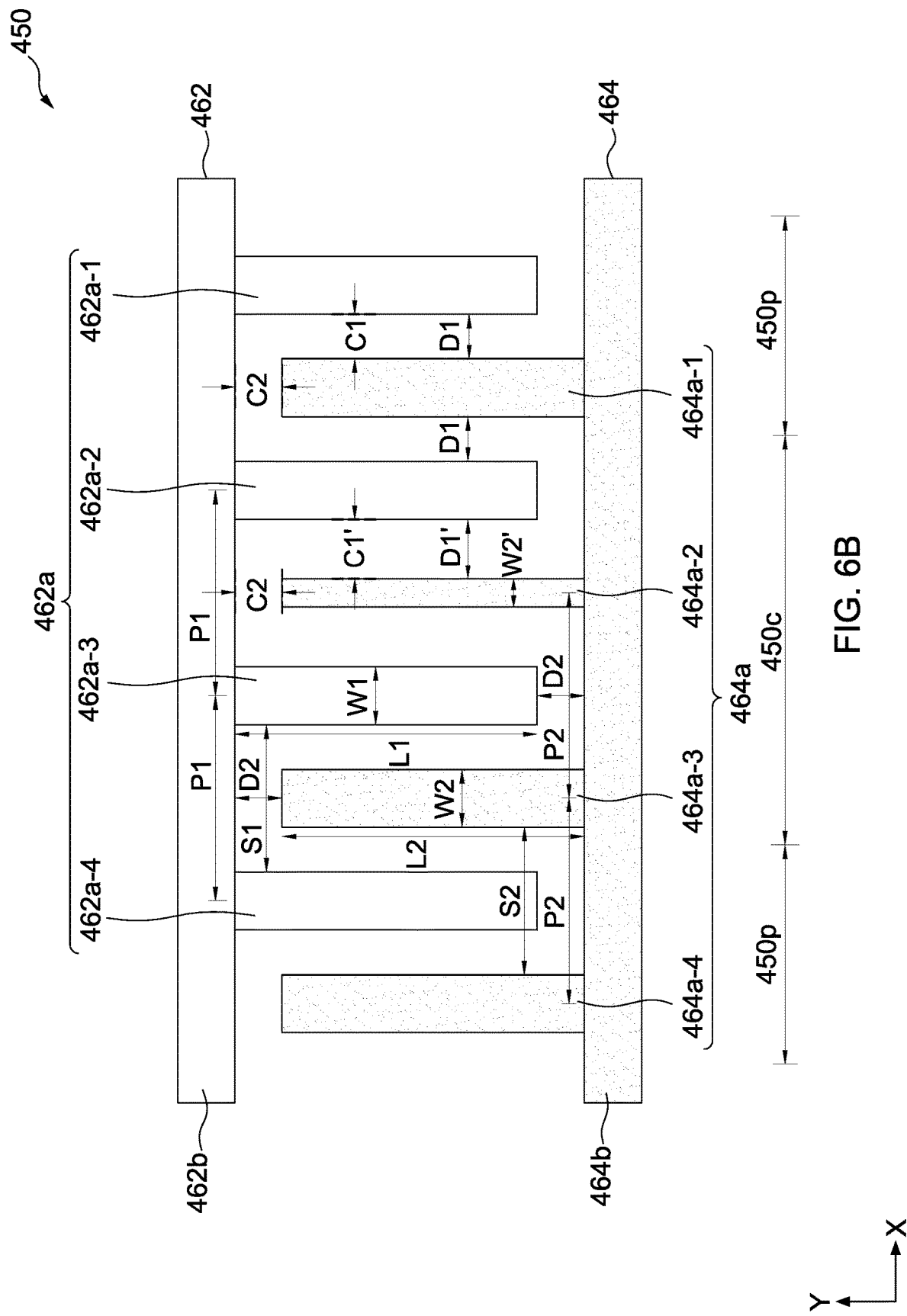
FIG. 6B is a top view illustrating the capacitor structure according to aspects of one or more embodiments of the present disclosure.

FIGS. 6A to 6B illustrate an alternative approach to obtaining a uniform capacitance. Referring to FIG. 6A, FIG. 6A illustrates a perspective view of a capacitor structure 450. The capacitor structure 450 may include two electrodes 462 and 464, which are separated by dielectric materials of the dielectric layer 116 (FIG. 1). Each of the electrodes 462 and 464 forms a three-dimensional structure. The electrodes 462 and 464 may be formed in a same metal layer (e.g., the conductive layer 152 in FIG. 1).

FIG. 6B illustrates a top view of the capacitor structure 450. The electrode 462 includes segments 462a and a bus 462b that connects all the segments 462a. The electrode 464 includes segments 464a and a bus 462b that connects all the segments 464a. In some embodiments, the segments 462a are arranged with an equal space S1 between neighboring segments 462a. Additionally, a pitch P1 between the segment 462a and each of its neighboring segments 462a is substantially consistent, and a pitch P2 between the segment 464a and each of its neighboring segments 464a is substantially consistent. In some embodiments, the pitch P1 is substantially equal to the pitch P2.

The segments 462a may include segments 462a-1, 462a-2, 462a-3 and 462a-4, and the segments 464a may include segments 464a-1, 464a-2, 464a-3 and 464a-4. Each segment 462a of the electrode 462 may have an identical width W1 and an identical length L1. Each segment 464a of the electrode 464 may have an identical length L2. The segments 464a-1, 464a-3 and 464a-4 may have an identical width W2, while the segment 464a-2 may have a width W2' different from the width W2. In some embodiments, the width W2' is at least 10% different from the width W2. As illustrated in FIG. 6B, the width W2 may be greater than the width W2'. In alternative embodiments, the width W2' is greater than the width W2.

Each of the segments 462a-1 and 462a-4 is spaced apart from its neighboring segment 464a-1 or 464a-4 by a distance D1. Each of the segments 462a-1 and 462a-4 forms a sub capacitor C1 with its neighboring segment 464a-1 or 464a-4. Due to a reduced width of the segment 464a-2, the segment 464a-2 is spaced apart from its neighboring segments 462a-2, 462a-3 by a distance D1'. The segment 464a-2 forms a sub capacitor C1' with each of its neighboring segments 462a-2, 462a-3. Each segment 462a/464a is spaced apart from its neighboring bus 464b/462b by a distance D2. Each segment 462a/464a forms a sub capacitor C2 with its neighboring bus 464b/462b. A total capacitance of the capacitor structure 450 is equivalent to a sum of capacitances of the sub capacitors (e.g., C1, C1' and C2).

The capacitor structure 450 may have a central region 450c and a peripheral region 450p. Due to the reduced width of the segment 464a-2, a capacitance of the peripheral region 450p is different from that of the central region 450c. The total capacitance of the capacitor structure 450 may be substantially not affected by voltage bias. Hence, the capacitor structure 450 may have a uniform capacitance (e.g., as shown in FIG. 3).

Figure 7A:
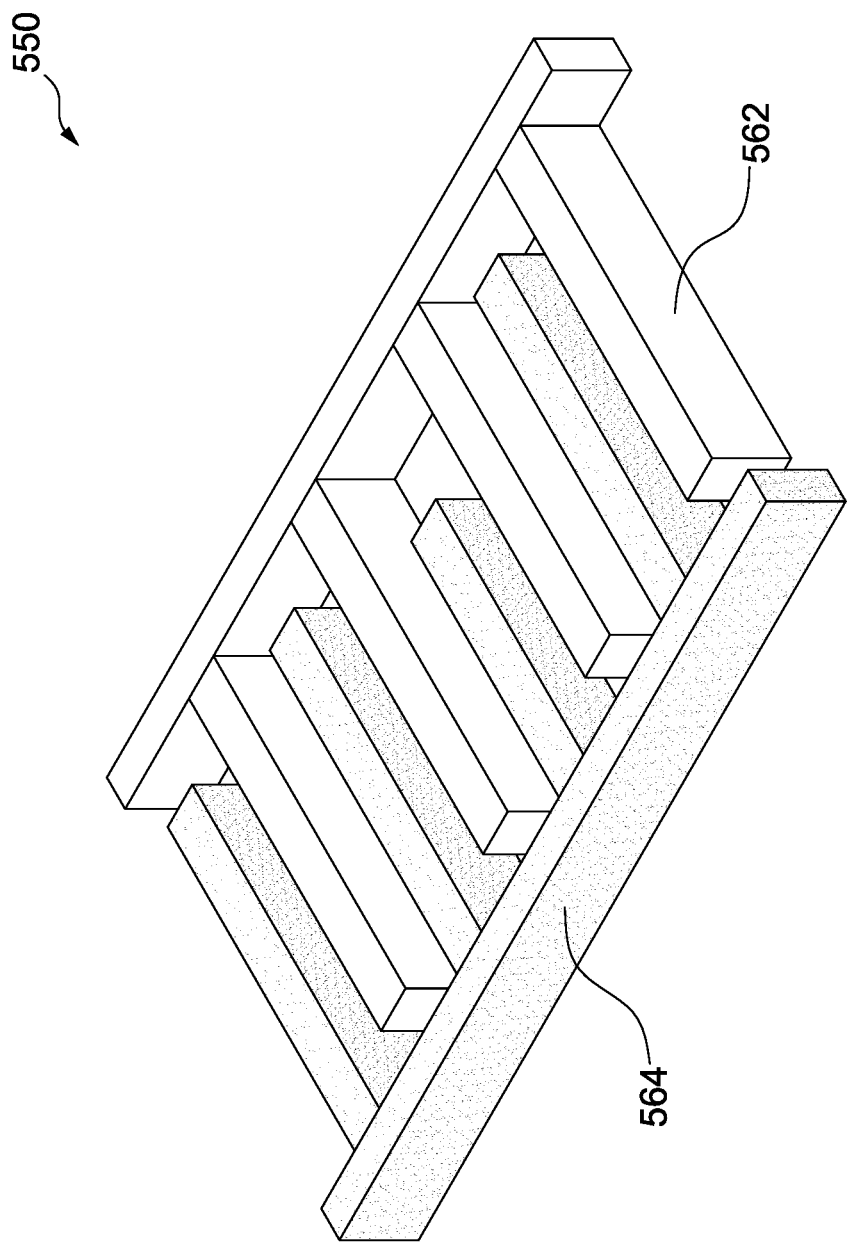
FIG. 7A is a perspective view illustrating a capacitor structure according to aspects of one or more embodiments of the present disclosure.
Figure 7B:
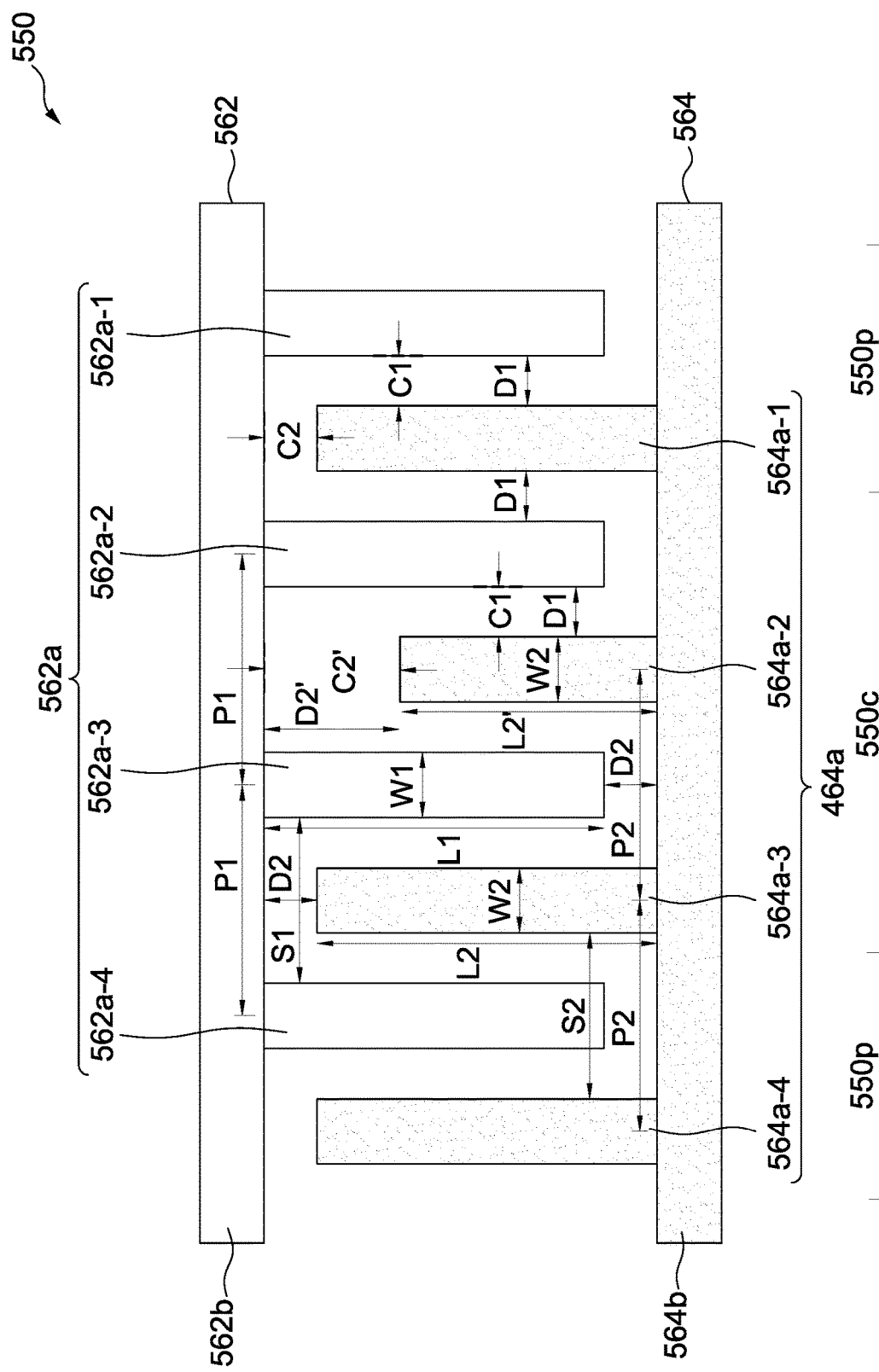
FIG. 7B is a top view illustrating the capacitor structure according to aspects of one or more embodiments of the present disclosure.

FIGS. 7A to 7B illustrate an alternative approach to obtaining a uniform capacitance. Referring to FIG. 7A, FIG. 7A illustrates a perspective view of a capacitor structure 550. The capacitor structure 550 may include two electrodes 562 and 564, which are separated by dielectric materials of the dielectric layer 116 (FIG. 1). Each of the electrodes 562 and 564 forms a three-dimensional structure. The electrodes 562 and 564 may be formed in a same metal layer (e.g., the conductive layer 152 in FIG. 1).

FIG. 7B illustrates a top view of the capacitor structure 550. The electrode 562 includes segments 562a and a bus 562b that connects all the segments 562a. The electrode 564 includes segments 564a and a bus 562b that connects all the segments 564a. In some embodiments, the segments 562a are arranged with an equal space S1 between neighboring segments 562a. In addition, a pitch P1 between the segment 562a and each of its neighboring segments 562a is substantially consistent. In some embodiments, the segments 564a are arranged with an equal space S2 between neighboring segments 564a. In addition, a pitch P2 between the segment 564a and each of its neighboring segments 564a is substantially consistent. In some embodiments, the space S1 is substantially equal to the space S2, and the pitch P1 is substantially equal to the pitch P2.

The segments 562a may include segments 562a-1, 562a-2, 562a-3 and 562a-4, and the segments 564a may include segments 564a-1, 564a-2, 564a-3 and 564a-4. Each segment 562a of the electrode 562 may have an identical width W1 and an identical length L1. Each segment 564a of the electrode 564 may have an identical length L2. Each of the segments 564a-1, 564a-3 and 564a-4 may have an identical width W2. Each of the segments 564a-1, 564a-3 and 564a-4 may have an identical length L2, while the segment 564a-2 may have a length L2' different from the length L2. In some embodiments, the length L2' is at least 10% different from the length L2. As illustrated in FIG. 7B, the length L2 may be greater than the length L2'. In alternative embodiments, the length L2' is greater than the length L2.

Each segment 562a is spaced apart from each of its neighboring segments 564a by a distance D1. Each segment 564a forms a sub capacitor C1 with each of its neighboring segments 562a. Each segment 562a is spaced apart from its neighboring bus 564b by a distance D2. Each segment 562a forms a sub capacitor C2 with its neighboring bus 564b. Each of the segments 564a-1, 564a-3 and 564a-4 is spaced apart from its neighboring bus 562b by the distance D2. Each of the segments 564a-1, 564a-3 and 564a-4 forms a sub capacitor C2 with its neighboring bus 562b. Due to a reduced length of the segment 564a-2, the segment 564a-2 is spaced apart from its neighboring bus 562b by a distance D2'. The segment 564a-2 forms a sub capacitor C2' with its neighboring bus 562b. A total capacitance of the capacitor structure 550 is equivalent to a sum of capacitances of the sub capacitors (e.g., C1, C2 and C2').

The capacitor structure 550 may have a central region 550c and a peripheral region 550p. Due to the reduced length of the segment 564a-2, a capacitance of the peripheral region 550p is different from that of the central region 550c. The total capacitance of the capacitor structure 550 may be substantially not affected by voltage bias. Hence, the capacitor structure 550 may have a uniform capacitance (e.g., as shown in FIG. 3).

Figure 8A:
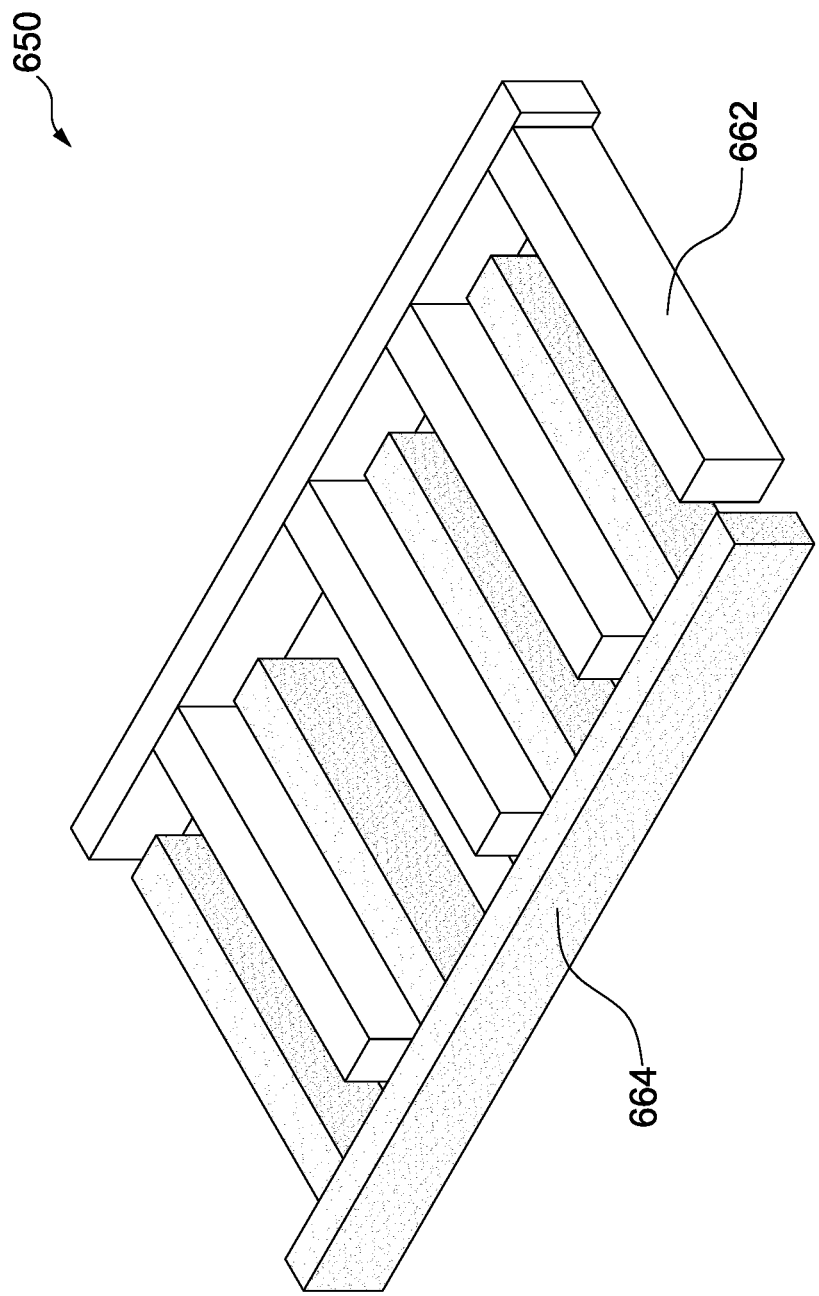
FIG. 8A is a perspective view illustrating a capacitor structure according to aspects of one or more embodiments of the present disclosure.
Figure 8B:
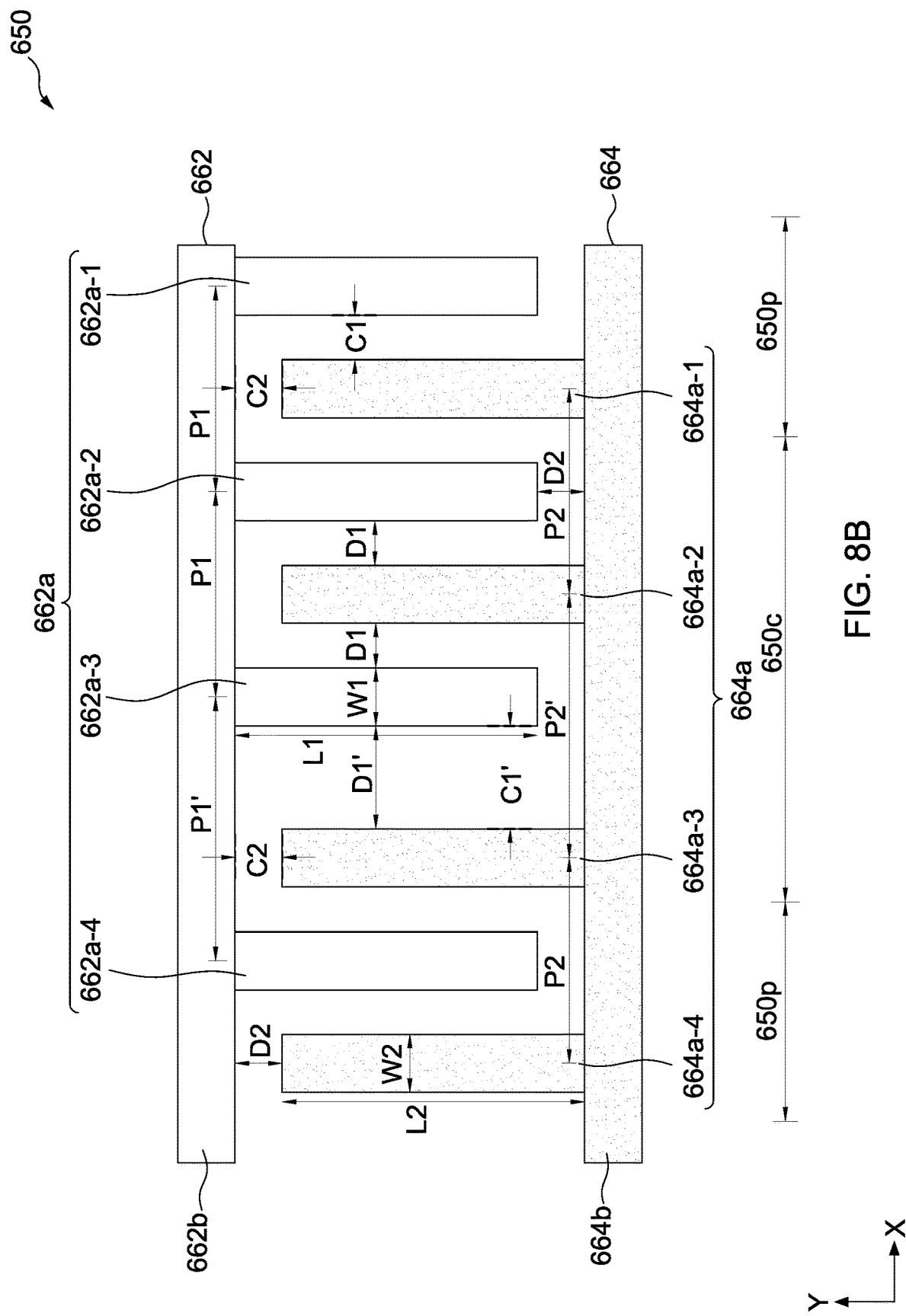
FIG. 8B is a top view illustrating the capacitor structure according to aspects of one or more embodiments of the present disclosure.

FIGS. 8A to 8B illustrate an alternative approach to obtaining a uniform capacitance. Referring to FIG. 8A, FIG. 8A illustrates a perspective view of a capacitor structure 650. The capacitor structure 650 may include two electrodes 662 and 664, which are separated by dielectric materials of the dielectric layer 116 (FIG. 1). Each of the electrodes 662 and 664 forms a three-dimensional structure. The electrodes 662 and 664 may be formed in a same metal layer (e.g., the conductive layer 152 in FIG. 1).

FIG. 8B illustrates a top view of the capacitor structure 650. The electrode 662 includes segments 662a and a bus 662b that connects all the segments 662a. The electrode 664 includes segments 664a and a bus 664b that connects all the segments 664a. Each segment 662a of the electrode 662 may have an identical width W1 and an identical length L1. Each segment 664a of the electrode 664 may have an identical width W2 and an identical length L2.

The segments 662a may include segments 662a-1, 662a-2, 662a-3 and 662a-4, and the segments 664a may include segments 664a-1, 664a-2, 664a-3 and 664a-4. In some embodiments, a pitch P1 between the segment 662a-2 and its neighboring segment 662a-3 is different from a pitch P1' between the segment 662a-3 and its neighboring segment 662a-4. In some embodiments, the pitch P1' is at least 10% different from the pitch P1. For example, the pitch P1' is greater than the pitch P1. In alternative embodiments, the pitch P1 is greater than the pitch P1'. In some embodiments, a pitch P2 between the segment 664a-1 and its neighboring segment 664a-2 is different from a pitch P2' between the segment 664a-2 and its neighboring segment 664a-3. In some embodiments, the pitch P2' is at least 10% different from the pitch P2. For example, the pitch P2' is greater than the pitch P2. In alternative embodiments, the pitch P2 is greater than the pitch P2'. In some embodiments, the pitch P1' and the pitch P2' are substantially the same.

Each of the segments 662a-1, 662a-2 and 662a-4 is spaced apart from its neighboring segments 664a-1, 664a-2 and/or 664a-4 by a distance D1. Each of the segments 662a-1, 662a-2 and 662a-4 forms a sub capacitor C1 with each of its neighboring segments 664a-1, 664a-2 and/or 664a-4. The segment 662a-3 is spaced apart from its neighboring segment 664a-2 by the distance D1, and spaced apart from its neighboring segment 664a-3 by a distance D1'. The segment 662a-3 forms a sub capacitor C1 with its neighboring segment 664a-2, and forms a sub capacitor C1' with its neighboring segment 664a-3. Each segment 662a/664a is spaced apart from its neighboring bus 664b/662b by a distance D2. Each segment 662a/664a forms a sub capacitor C2 with its neighboring bus 664b/662b. A total capacitance of the capacitor structure 650 is equivalent to a sum of capacitances of the sub capacitors (e.g., C1, C1' and C2).

The capacitor structure 650 may have a central region 650c and a peripheral region 650p. Due to an enlarged space between the segments 662a-3 and 664a-3, a capacitance of the central region 650c is different from that of the peripheral region 650p. The total capacitance of the capacitor structure 650 may be substantially not affected by voltage bias. Hence, the capacitor structure 650 may have a uniform capacitance (e.g., as shown in FIG. 3).

Figure 9A:
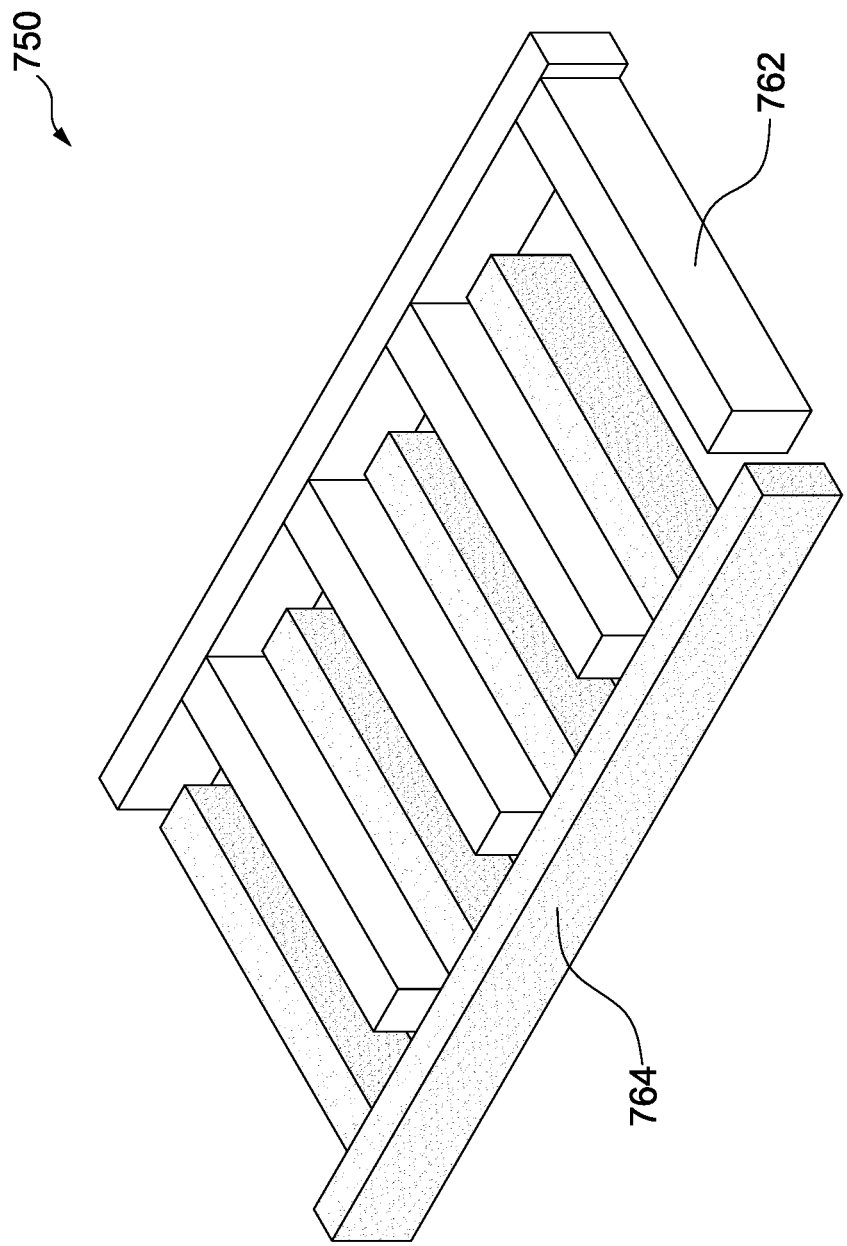
FIG. 9A is a perspective view illustrating a capacitor structure according to aspects of one or more embodiments of the present disclosure.
Figure 9B:
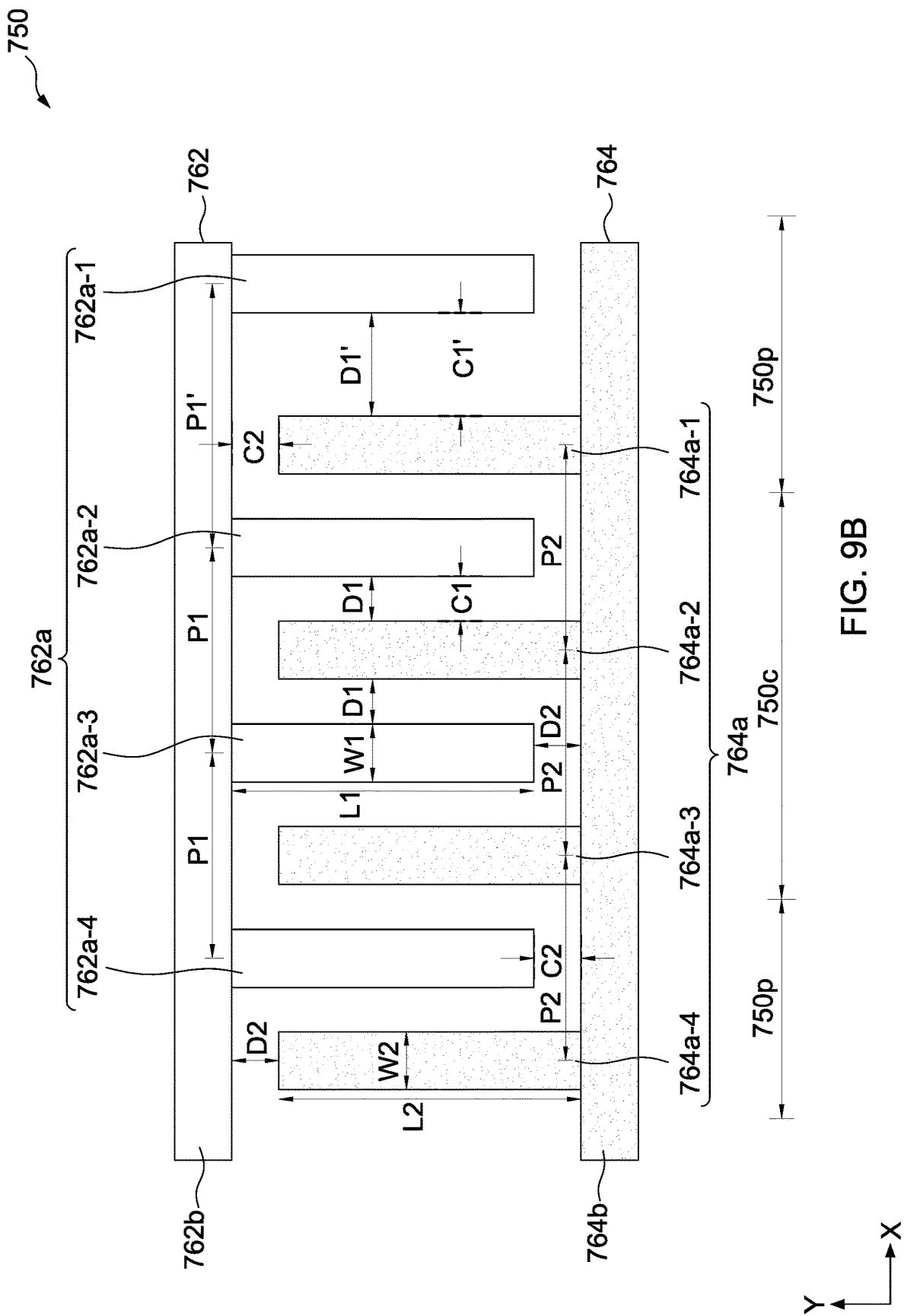
FIG. 9B is a top view illustrating the capacitor structure according to aspects of one or more embodiments of the present disclosure.

FIGS. 9A to 9B illustrate an alternative approach to obtaining a uniform capacitance. Referring to FIG. 9A, FIG. 9A illustrates a perspective view of a capacitor structure 750. The capacitor structure 750 may include two electrodes 762 and 764, which are separated by dielectric materials of the dielectric layer 116 (FIG. 1). Each of the electrodes 762 and 764 forms a three-dimensional structure. The electrodes 762 and 764 may be formed in a same metal layer (e.g., the conductive layer 152 in FIG. 1).

FIG. 9B illustrates a top view of the capacitor structure 750. The electrode 762 includes segments 762a and a bus 762b that connects all the segments 762a. The electrode 764 includes segments 764a and a bus 764b that connects all the segments 764a. Each segment 762a of the electrode 762 may have an identical width W1 and an identical length L1. Each segment 764a of the electrode 764 may have an identical width W2 and an identical length L2.

The segments 762a may include segments 762a-1, 762a-2, 762a-3 and 762a-4, and the segments 764a may include segments 764a-1, 764a-2, 764a-3 and 764a-4. In some embodiments, a pitch P1 between the segment 762a-2 and its neighboring segment 762a-3 is different from a pitch P1' between the segment 762a-1 and its neighboring segment 762a-2. In some embodiments, the pitch P1' is at least 10% different from the pitch P1. For example, the pitch P1' is greater than the pitch P1. In alternative embodiments, the pitch P1 is greater than the pitch P1'. In some embodiments, pitches P2 between the segments 764a are substantially the same.

Each of the segments 762a-2, 762a-3 and 762a-4 is spaced apart from each of its neighboring segments 764a-1, 764a-2, 764a-3 and/or 764a-4 by a distance D1. Each of the segments 762a-2, 762a-3 and 762a-4 forms a sub capacitor C1 with each of its neighboring segments 764a-1, 764a-2, 764a-3 and/or 764a-4. The segment 762a-1 is spaced apart from its neighboring segment 764a-1 by a distance D1'. The segment 762a-1 forms a sub capacitor C1' with its neighboring segment 764a-1. Each segment 762a/764a is spaced apart from its neighboring bus 764b/762b by a distance D2. Each segment 762a/764a forms a sub capacitor C2 with its neighboring bus 764b/762b. A total capacitance of the capacitor structure 750 is equivalent to a sum of capacitances of the sub capacitors (e.g., C1, C1' and C2).

The capacitor structure 750 may have a central region 750c and a peripheral region 750p. Due to an enlarged space between the segments 762a-1 and 764a-1, a capacitance of the central region 750c is different from that of the peripheral region 750p. The total capacitance of the capacitor structure 750 may be substantially not affected by voltage bias. Hence, the capacitor structure 750 may have a uniform capacitance (e.g., as shown in FIG. 3).

Figure 10:
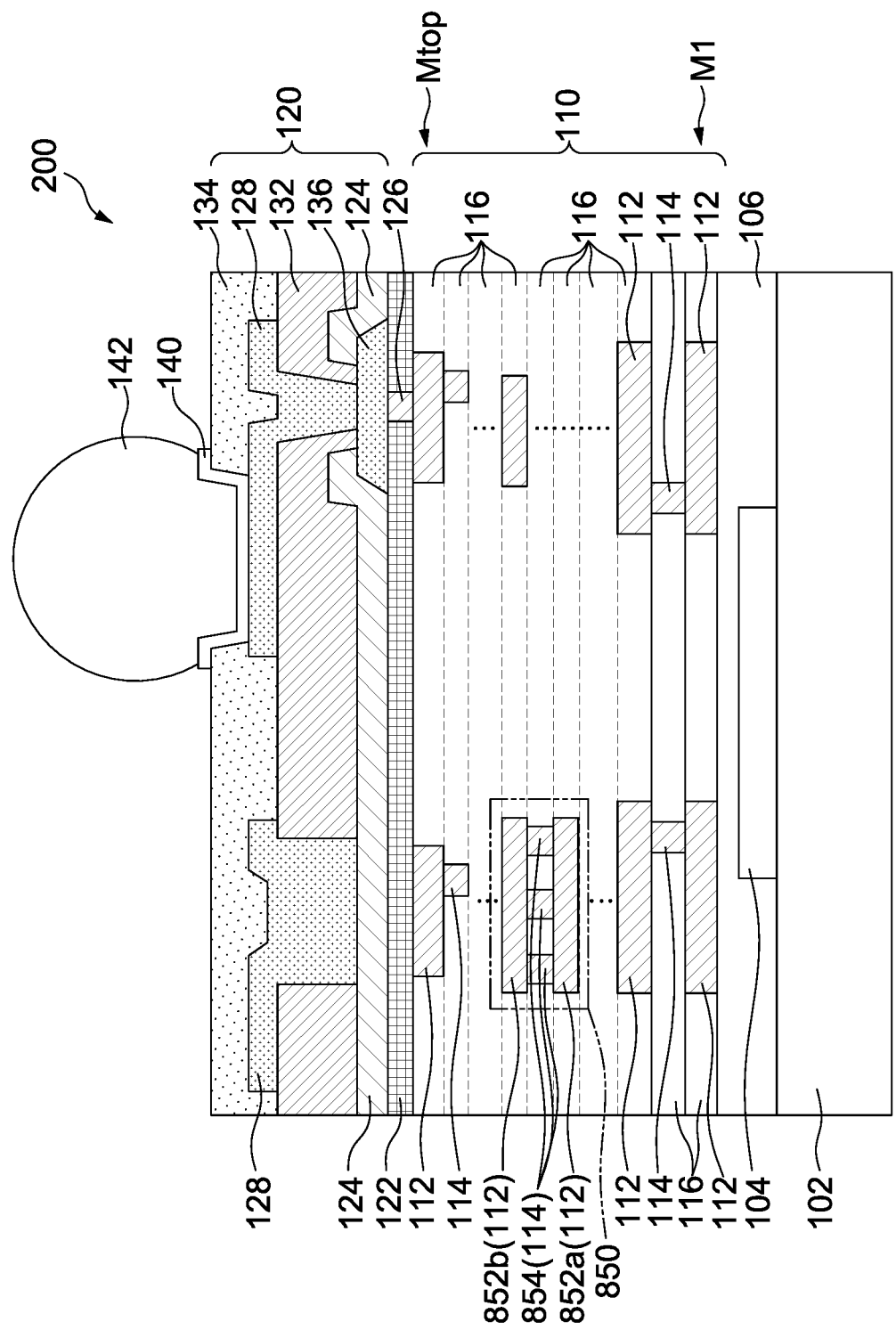
FIG. 10 is a cross-sectional view illustrating a semiconductor structure according to aspects of one or more embodiments of the present disclosure.

FIG. 10 is a cross-sectional view illustrating a semiconductor structure 200 according to aspects of one or more embodiments of the present disclosure. The semiconductor structure 200 may include a capacitor structure 850 disposed in the interconnect structure 110. In some embodiments, the capacitor structure 850 includes a first conductive layer 852a, a second conductive layer 852b and one or more conductive vias 854. A material of the first conductive layer 852a, the second conductive layer 852b and the conductive vias 854 may be selected from candidate materials that are same as those of the metal lines 112 and the vias 114.

Figure 11A:
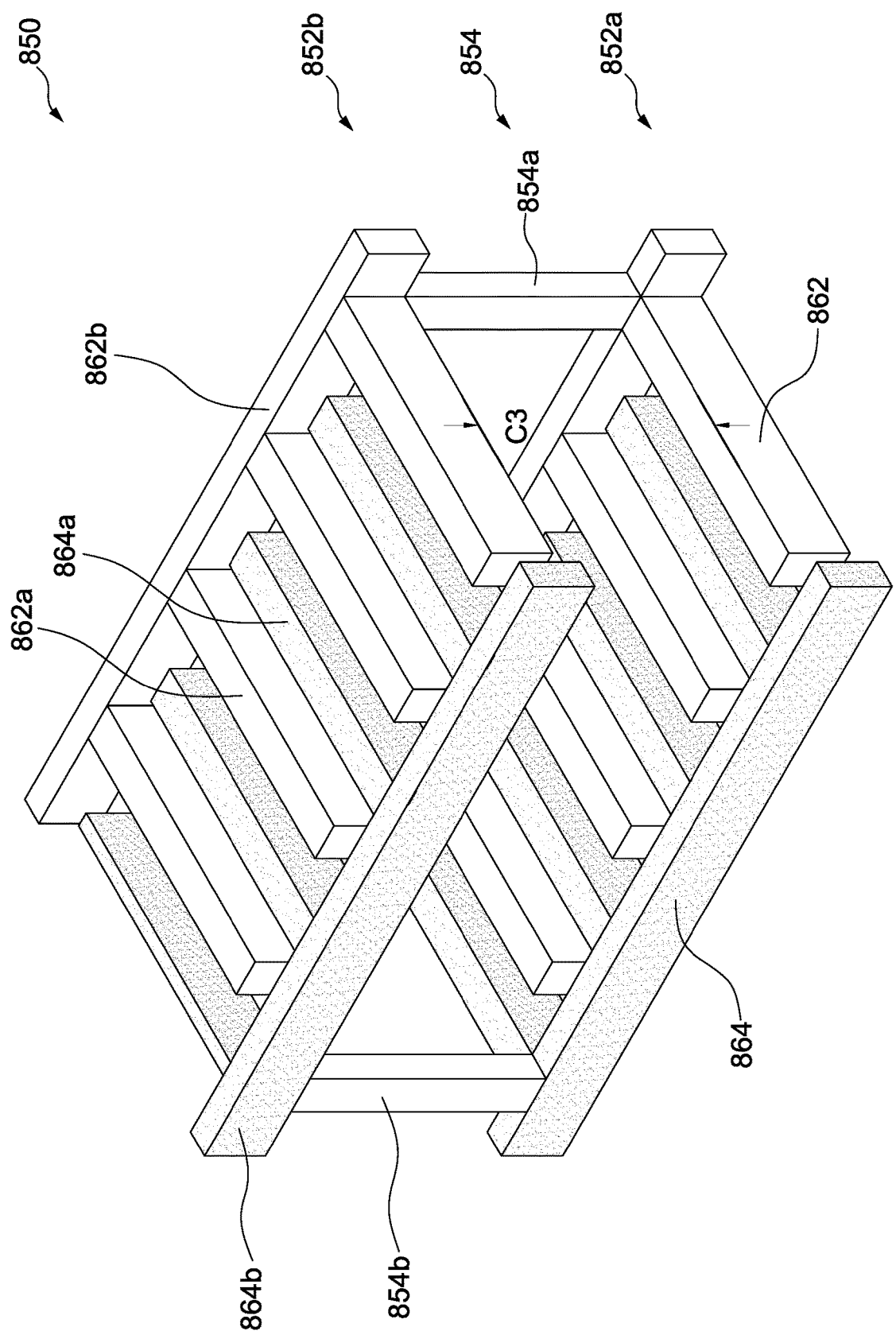
FIG. 11A is a perspective view illustrating a capacitor structure according to aspects of one or more embodiments of the present disclosure.

Referring to FIG. 11A, FIG. 11A illustrates a perspective view of the capacitor structure 850. The capacitor structure 850 may include two electrodes 862 and 864, which are separated by dielectric materials of the dielectric layer 116 (FIG. 10). Each of the electrodes 862 and 864 forms a three-dimensional structure. For clarity, the electrode 862 is shown as unpatterned, and the electrode 864 is patterned with dots. The electrodes 862 and 864 may include more than one metal layer (e.g., the first conductive layer 852a and the second conductive layer 852b) connected by vias (e.g., the conductive vias 854). The electrode 862 includes segments 862a and a bus 862b that connects all the segments 862a. The electrode 864 includes segments 864a and a bus 864b that connects all the segments 864a. Each segment 862a/864a forms a sub capacitor (e.g., C1 and C2) with each of its neighboring segments 864a/862a or the bus 862b/864b.

Figure 11B:
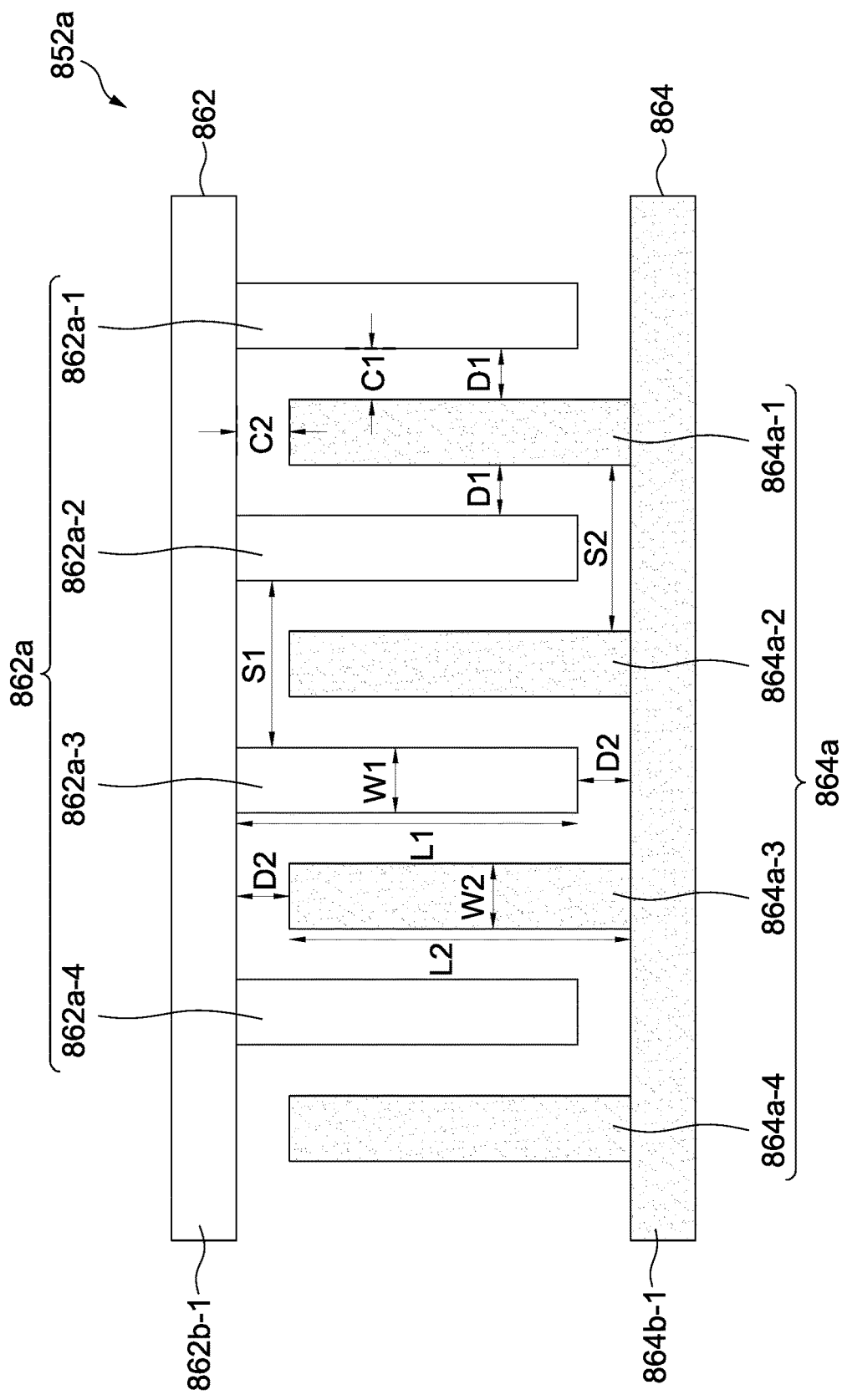
FIGS. 11B-11C are top views illustrating the capacitor structure according to aspects of one or more embodiments of the present disclosure.

FIG. 11B illustrates a top view of the first conductive layer 852a. The electrode 862 includes segments 862a-1, 862a-2, 862a-3 and 862a-4 and a bus 862b-1 in the first conductive layer 852a. The electrode 864 includes segments 864a-1, 864a-2, 864a-3 and 864a-4 and a bus 864b-1 in the first conductive layer 852a. The segments 862a-1, 862a-2, 862a-3 and 862a-4 and the segments 864a-1, 864a-2, 864a-3 and 864a-4 are arranged in an alternating pattern with an equal space between neighboring segments.

Figure 11C:
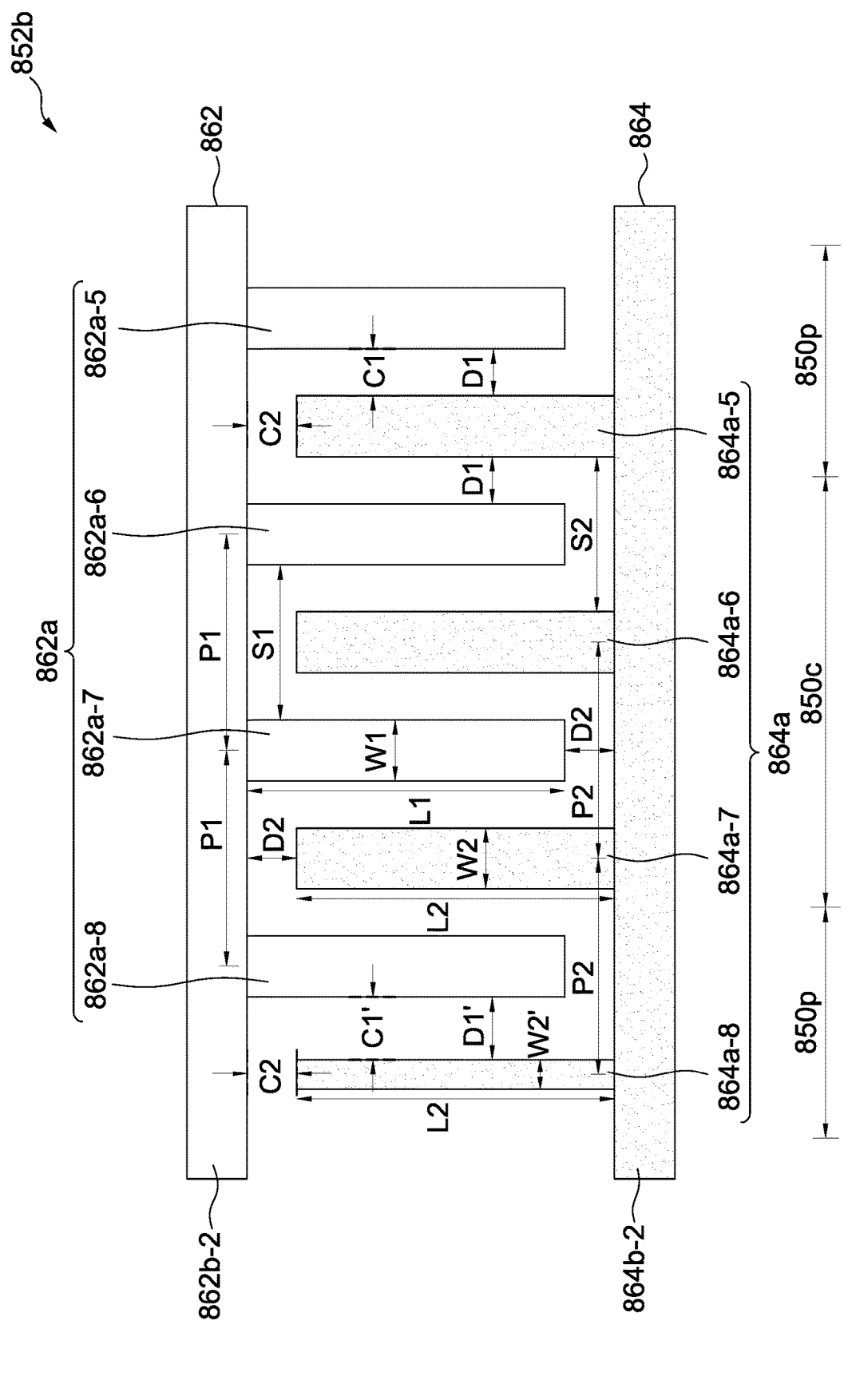

FIG. 11C illustrates a top view of the second conductive layer 852b, which overlies the first conductive layer 852a. In alternative embodiments, the second conductive layer 852b underlies the first conductive layer 852a. Similarly, the electrodes 862 and 864 in the second conductive layer 852b include buses 862b-2 and 864b-2, and segments 862a-5, 862a-6, 862a-7 and 862a-8 and 864a-5, 864a-6, 864a-7 and 864a-8, respectively. The segment 864a-8 may have a reduced dimension similar to that of the segment 264a-4 described with reference to FIG. 4B.

In some embodiments, the bus 862b-1 in the first conductive layer 852a and the bus 862b-2 in the second conductive layer 852b have similar shapes and sizes and are overlapping vertically. In addition, the bus 864b-1 in the first conductive layer 852a and the bus 864b-2 in the second conductive layer 852b may also have similar shapes and sizes and are overlapping vertically. At least one conductive via 854a connects the buses 862b-1 and 862b-2 in the first conductive layer 852a and the second conductive layer 852b, thereby forming an integral electrode 862. Similarly, at least one conductive via 854b connects the buses 864b-1 and 864b-2 in the first conductive layer 852a and the second conductive layer 852b, thereby forming an integral electrode 864.

Referring to FIGS. 11A to 11C, a direction of the segments in the first conductive layer 852a is parallel to a direction of segments in the second conductive layer 852b. In some embodiments, the segments 862a-1, 862a-2, 862a-3 and 862a-4 in the first conductive layer 852a and the segments 862a-5, 862a-6, 862a-7 and 862a-8 in the second conductive layer 852b have similar shapes and sizes and are overlapping vertically. In addition, the segments 864a-1, 864a-2, 864a-3 and 864a-4 in the first conductive layer 852a and the segments 864a-5, 864a-6, 864a-7 and 864a-8 in the second conductive layer 852b are overlapping vertically. The segments 864a-1, 864a-2, 864a-3 and 864a-4 in the first conductive layer 852a and the segments 864a-5, 864a-6 and 864a-7 may have similar shapes and sizes, while the segment 864a-8 has a smaller shape and size. Hence, a capacitance of the peripheral region 850p is different from that of the central region 850c.

In addition to the capacitance in each of the conductive layers (e.g., 852a and 852b), the capacitance of capacitor structure 850 also includes portions created by the overlap between the different conductive layers. As illustrated in FIG. 11A, the segment 862a-1 forms a sub capacitor C3 with its underlying segment 862a-5. Hence, the overlapping portions also contribute to the total capacitance of capacitor structure 850. The total capacitance of the capacitor structure 850 may be substantially not affected by voltage bias. Hence, the capacitor structure 850 may have a uniform capacitance (e.g., as shown in FIG. 3).

The segments 862a-1, 862a-2, 862a-3 and 862a-4, and the bus 862b-1 may collectively be referred to as a first sub electrode of a first sub capacitor in the first conductive layer 852a. The segments 864a-1, 864a-2, 864a-3 and 864a-4, and the bus 864b-1 may collectively be referred to as a second sub electrode of the first sub capacitor in the first conductive layer 852a. The segments 862a-5, 862a-6, 862a-7 and 862a-8, and the bus 862b-2 may be referred to as a first sub electrode of a second sub capacitor in the second conductive layer 852b. The segments 864a-5, 864a-6, 864a-7 and 864a-8, and the bus 864b-2 may collectively be referred to as a second sub electrode of the second sub capacitor in the second conductive layer 852b. Due to the reduced dimension of the segment 864a-8, a capacitance of the first sub capacitor in the first conductive layer 852a may be different from a capacitance of the second sub capacitor in the second conductive layer 852b.

The capacitor structure 850 of the present disclosure is not limited to the above-mentioned embodiment and may have other, different embodiments. For example, the segments 862a or 864a of the electrode 862 or the electrode 864 may have layouts similar to those discussed above with respect to FIGS. 5A to 9B.

Figure 12:
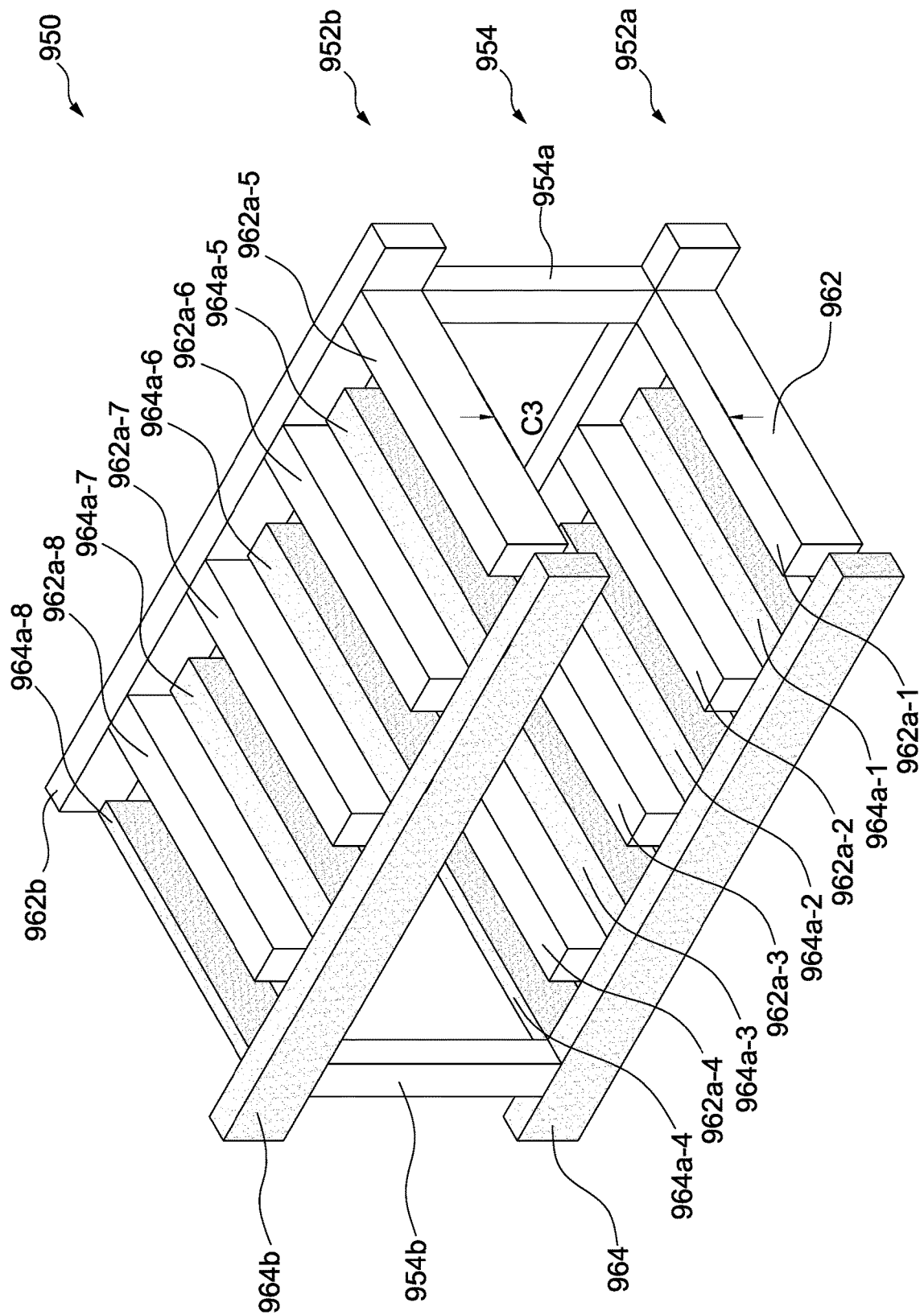
FIG. 12 is a perspective view illustrating a capacitor structure according to aspects of one or more embodiments of the present disclosure.

FIG. 12 illustrates an alternative approach to obtaining a uniform capacitance. Referring to FIG. 12, a capacitor structure 950 may include two electrodes 962 and 964, which are separated by dielectric materials of the dielectric layer 116 (FIG. 10). Each of the electrodes 962 and 964 forms a three-dimensional structure. The electrodes 962 and 964 may include more than one metal layer (e.g., the first conductive layer 952a and the second conductive layer 952b) connected by vias (e.g., conductive vias 954). The electrode 962 includes segments 962a and a bus 962b that connects all the segments 962a. The electrode 964 includes segments 964a and a bus 964b that connects all the segments 964a.

In some embodiments, the segments 962a-1, 962a-2, 962a-3 and 962a-4 in the first conductive layer 952a and the segments 962a-5, 962a-6, 962a-7 and 962a-8 in the second conductive layer 952b respectively have similar shapes and sizes and are overlapping vertically. In addition, the segments 964a-1, 964a-2, 964a-3 and 964a-4 in the first conductive layer 952a and the segments 964a-5, 964a-6, 964a-7 and 964a-8 in the second conductive layer 952b respectively have similar shapes and sizes and are overlapping vertically. Both the segment 964a-4 in the first conductive layer 952a and the segment 964a-8 in the second conductive layer 952b may have smaller shapes and sizes. In some embodiments, the segment 964a-8 completely overlaps the segment 964a-4. In alternative embodiments, the segment 964a-8 partially overlaps the segment 964a-4. In other embodiments, the segment 964a-8 may not overlap the segment 964a-4. In other words, the segment 964a-8 may be offset from the segment 964a-4 along a direction parallel to the surface of the second conductive layer 952b.

The capacitor structure 950 of the present disclosure is not limited to the above-described embodiments and may have other, different embodiments. For example, the segments 962a of the electrode 962 or the segments 964a of the electrode 964 may have layouts similar to those discussed above with respect to FIGS. 5A to 9B. Alternatively, the segments in the first conductive layer 952a and the segments in the second conductive layer 952b may have different layouts. For example, the segments in the first conductive layer 952a have a layout similar to those discussed above with respect to FIGS. 5A to 5B, while the segments in the first conductive layer 952a have another layout similar to those discussed above with respect to FIGS. 6A to 6B.

Figure 13:
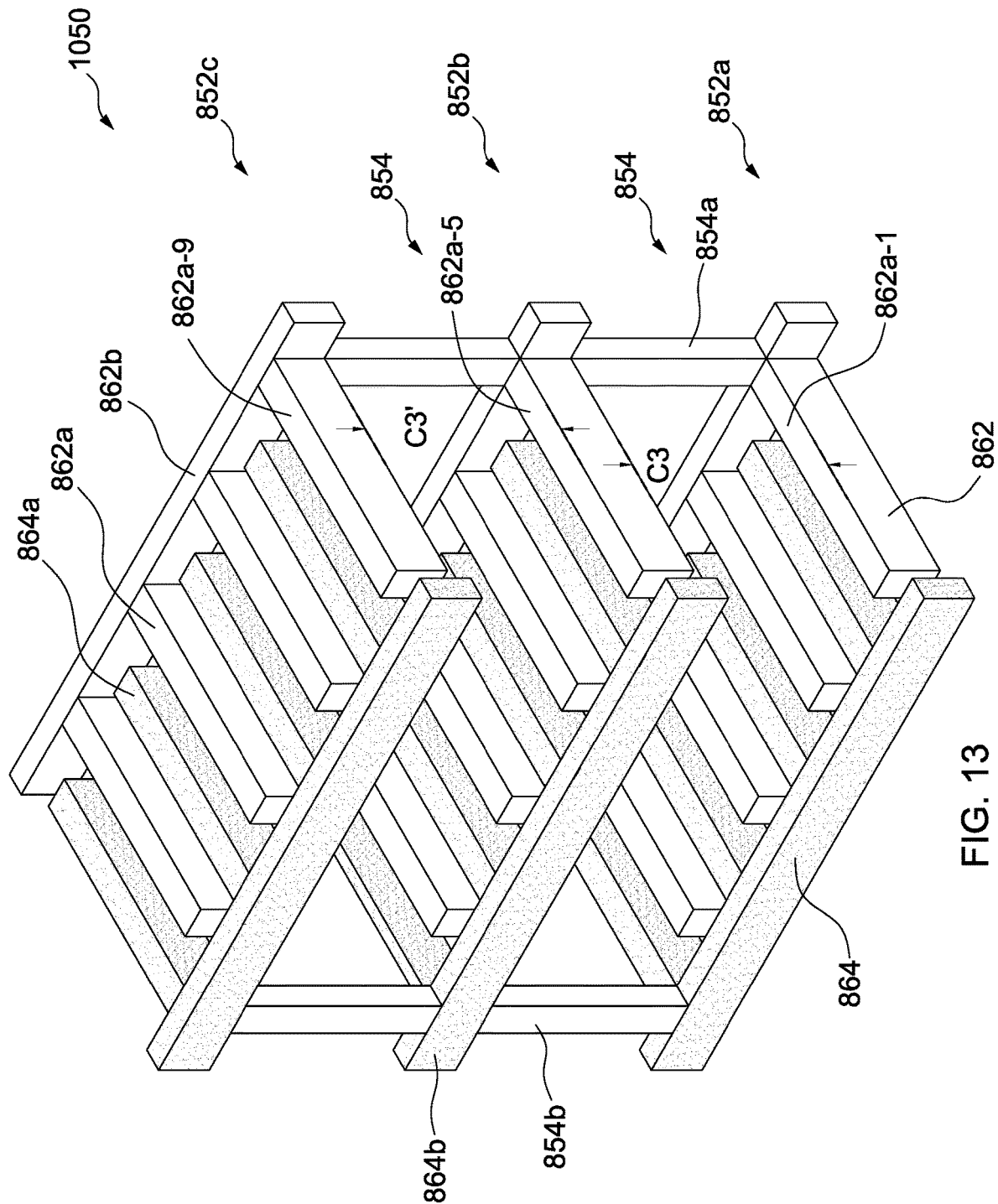
FIG. 13 is a perspective view illustrating a capacitor structure according to aspects of one or more embodiments of the present disclosure.

FIG. 13 is a perspective view of a capacitor structure 1050. Many aspects of the capacitor structure 1050 are similar to those discussed above with respect to FIGS. 11A to 11C, and are hereby omitted from discussion for brevity. In some embodiments, the capacitor structure 1050 further includes a third conductive layer 852c overlying the second conductive layer 852b. In addition to a capacitance of each of the conductive layers (e.g., 852a, 852b and 852c), a total capacitance of the capacitor structure 1050 also includes portions created by overlap between different conductive layers. As illustrated in FIG. 13, a segment 862a-1 forms a sub capacitor C3 with its underlying segment 862a-5. Furthermore, a segment 862a-5 forms a sub capacitor C3' with its underlying segment 862a-9. Hence, the overlapping portions also contribute to the total capacitance of the capacitor structure 1050. The total capacitance of the capacitor structure 1050 may be substantially not affected by voltage bias. Hence, the capacitor structure 1050 may have a uniform capacitance.

The capacitor structure 1050 of the present disclosure is not limited to the above-mentioned embodiments and may have other, different embodiments. For example, the segments in the first conductive layer 852a, the segments in the second conductive layer 852b and the segments in the third conductive layer 852c may have different layouts.

The present disclosure provides many different embodiments of a capacitor structure that provide one or more improvements over existing approaches. The proposed capacitor structure includes at least one segment having a width, a length or a space different from those of other segments. Hence, capacitances of different regions of the proposed capacitor structure may be different. The proposed capacitor structure may have a capacitance that is substantially not affected by voltage bias. Accordingly, better performance of the proposed capacitor structure may be expected.

In accordance with some embodiments of the present disclosure, a capacitor structure is provided. The capacitor structure includes a first electrode and a second electrode. The first electrode includes a first segment and a third segment extending in a first direction. The second electrode includes a second segment and a fourth segment extending in the first direction, the second segment is interposed between the first segment and the third segment, and the third segment is interposed between the second segment and the fourth segment. A first distance is between the first segment and the second segment, a second distance is between the second segment and the third segment, and a third distance is between the third segment and the fourth segment. The first distance is different from the second distance.

In accordance with some embodiments of the present disclosure, a capacitor structure is provided. The capacitor structure includes a first region and a second region adjacent to the first region. The capacitor structure includes a first electrode, a second electrode and a dielectric layer. The first electrode includes a plurality of first segments disposed in the first region and a third segment disposed in the second region. The second electrode includes a plurality of second segments disposed in the first region and a fourth segment disposed in the second region. The plurality of first segments and the plurality of second segments are arranged in an alternating pattern. The third segment is between the fourth segment and an adjacent second segment of the plurality of second segments. The dielectric layer is between the first electrode and the second electrode. In some embodiments, a capacitance of the first region is different from a capacitance of the second region.

In accordance with some embodiments of the present disclosure, a capacitor structure is provided. The capacitor structure includes a first capacitor in a first metallization layer and a second capacitor in a second metallization layer. The first capacitor includes a first electrode including a plurality of first segments and a second electrode including a plurality of second segments. The plurality of first segments and the plurality of second segments are arranged in an alternating pattern. The second capacitor includes a third electrode including a plurality of third segments and a fourth electrode including a plurality of fourth segments. The plurality of third segments and the plurality of fourth segments are arranged in an alternating pattern. Each of the plurality of third segments respectively overlaps each of the plurality of first segments. Each of the plurality of fourth segments respectively overlaps each of the plurality of second segments. In some embodiments, a dimension of a fourth segment of the plurality of fourth segments is different from a dimension of a second segment of the plurality of second segments.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor structure, comprising:
   a first electrode, wherein the first electrode includes a first segment and a third segment extending in a first direction;
   a second electrode, wherein the second electrode includes a second segment and a fourth segment extending in the first direction, the second segment is interposed between the first segment and the third segment, and the third segment is interposed between the second segment and the fourth segment;
   a first distance between the first segment and the second segment;
   a second distance between the second segment and the third segment; and
   a third distance between the third segment and the fourth segment,
   wherein the first distance is different from the second distance,
   wherein the first segment of the first electrode is disposed in a first region, and the third segment of the first electrode, the second segment of the second electrode and the fourth segment of the second electrode are disposed in a second region,
   wherein a capacitance of the capacitor structure in the first region is different from a capacitance of the capacitor structure in the second region, and
   wherein a total capacitance of the capacitor structure is uniform in different voltage bias.

2. The capacitor structure of claim 1, wherein the second distance is substantially equal to the third distance.

3. The capacitor structure of claim 1, wherein a width of the first segment is different from a width of the third segment.

4. The capacitor structure of claim 3, wherein a width of the second segment is substantially equal to the width of the third segment.

5. The capacitor structure of claim 1, wherein a width of the first segment is substantially equal to a width of the third segment, and a width of the second segment is substantially equal to the width of the third segment.

6. The capacitor structure of claim 1, wherein a length of the first segment is different from a length of the third segment.

7. The capacitor structure of claim 6, wherein a length of the second segment is substantially equal to a length of the fourth segment.

8. The capacitor structure of claim 1, wherein the first electrode includes a first bus extending in a second direction and connected to the first segment and the third segment, and the second electrode includes a second bus extending in the second direction and connected to the second segment and the fourth segment.

9. The capacitor structure of claim 8, wherein a first spacing between the first segment and the second bus is different from a second spacing between the third segment and the second bus.

10. The capacitor structure of claim 9, wherein a third spacing between the second segment and the first bus is substantially equal to a fourth spacing between the fourth segment and the first bus.

11. The capacitor structure of claim 1, wherein the first electrode and the second electrode are separated by a dielectric layer, and a thickness of the dielectric layer varies between the first electrode and the second electrode.

12. The capacitor structure of claim 1, wherein the first electrode and the second electrode are disposed in a same metallization layer.

13. A capacitor structure, comprising:
   a first region and a second region adjacent to the first region;
   a first electrode including a plurality of first segments disposed in the first region and a third segment disposed in the second region;
   a second electrode including a plurality of second segments disposed in the first region and a fourth segment disposed in the second region, wherein the plurality of first segments and the plurality of second segments are arranged in an alternating pattern, and the third segment is between the fourth segment and an adjacent second segment of the plurality of second segments; and a dielectric layer between the first electrode and the second electrode, wherein a capacitance of the first region is different from a capacitance of the second region, and wherein a total capacitance of the capacitor structure is uniform in different voltage bias.

14. The capacitor structure of claim 13, wherein a width of the dielectric layer between a first segment of the plurality of first segments and an adjacent second segment of the plurality of second segments is different from a width of the dielectric layer between the third segment and the fourth segment.

15. The capacitor structure of claim 13, wherein a dimension of a first segment of the plurality of first segments is different from a dimension of the third segment, and a dimension of a second segment of the plurality of second segments is substantially equal to a dimension of the fourth segment.

16. The capacitor structure of claim 13, wherein a dimension of a first segment of the plurality of first segments is different from of a dimension of another first segment of the plurality of first segments.

17. The capacitor structure of claim 13, wherein the first region is a central region, and the second region is a peripheral region.

18. A capacitor structure, comprising:
a first capacitor in a first metallization layer, wherein the first capacitor includes:
a first electrode including a plurality of first segments; and
a second electrode including a plurality of second segments, wherein the plurality of first segments and the plurality of second segments are arranged in an alternating pattern; and a second capacitor in a second metallization layer over the first metallization layer, wherein the second capacitor includes:
a third electrode including a plurality of third segments; and
a fourth electrode including a plurality of fourth segments, wherein the plurality of third segments and the plurality of fourth segments are arranged in an alternating pattern, wherein each of the plurality of third segments respectively overlaps each of the plurality of first segments, each of the plurality of fourth segments respectively overlaps each of the plurality of second segments, and a dimension of a fourth segment of the plurality of fourth segments is different from a dimension of a second segment of the plurality of second segments, wherein the first capacitor has a first central region and a first peripheral region, the second capacitor has a second central region and a second peripheral region, wherein the second central region overlaps the first central region, and the second peripheral region overlaps the first peripheral region;

wherein a capacitance of the second capacitor in the second peripheral region is different from a capacitance of the second capacitor in the second central region, and wherein a total capacitance of the first capacitor and the second capacitor is uniform in different voltage bias.

19. The capacitor structure of claim 18, wherein a capacitance of the first capacitor is different from the capacitance of the second capacitor.

20. The capacitor structure of claim 18, wherein the first electrode is electrically connected to the third electrode through a first via, and the second electrode is electrically connected to the fourth electrode through a second via.

* * * * *